(12) United States Patent
Mazure et al.

(10) Patent No.: US 8,508,289 B2
(45) Date of Patent: Aug. 13, 2013

(54) DATA-PATH CELL ON AN SEOI SUBSTRATE WITH A BACK CONTROL GATE BENEATH THE INSULATING LAYER

(75) Inventors: Carlos Mazure, Bernin (FR); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 283 days.

(21) Appl. No.: 13/013,580

(22) Filed: Jan. 25, 2011

(65) Prior Publication Data

US 2011/0133822 A1    Jun. 9, 2011

Related U.S. Application Data

(63) Continuation-in-part of application No. 12/961,293, filed on Dec. 6, 2010, now Pat. No. 8,384,425, and a continuation-in-part of application No. 13/007,483, filed on Jan. 14, 2011, now Pat. No. 8,432,216.

(30) Foreign Application Priority Data

Dec. 8, 2009   (FR) ...................................... 09 58747
Mar. 3, 2010   (FR) ...................................... 10 51526

(51) Int. Cl.
*G05F 1/10*         (2006.01)
*H01L 27/105*    (2006.01)
*G06F 17/50*     (2006.01)

(52) U.S. Cl.
USPC ..... 327/537; 257/365; 716/122; 257/E27.081

(58) Field of Classification Search
None
See application file for complete search history.

(56) References Cited

U.S. PATENT DOCUMENTS

| | | | |
|---|---|---|---|
| 4,169,233 A | 9/1979 | Haraszti | 307/355 |
| 5,028,810 A | 7/1991 | Castro et al. | 307/201 |
| 5,306,530 A | 4/1994 | Strongin et al. | 427/533 |
| 5,325,054 A | 6/1994 | Houston | 324/158 |
| 5,455,791 A | 10/1995 | Zaleski et al. | 365/185.26 |
| 5,557,231 A | 9/1996 | Yamaguchi et al. | 327/534 |

(Continued)

FOREIGN PATENT DOCUMENTS

| EP | 1 081 748 A2 | 3/2001 |
|---|---|---|
| EP | 1 095 407 A1 | 5/2001 |

(Continued)

OTHER PUBLICATIONS

U.S. Appl. No. 12/793,553, filed Jun. 3, 2010.

(Continued)

*Primary Examiner* — Crystal L Hammond
(74) *Attorney, Agent, or Firm* — Winston & Strawn LLP

(57) ABSTRACT

This invention provides a semiconductor device structure formed on a conventional semiconductor-on-insulator (SeOI) substrate defined by a pattern defining at least one field-effect transistor having: in the thin film of the SeOI substrate, a source region, a drain region, a channel region, and a front control gate region formed above the channel region; and in the base substrate beneath the buried oxide of the SeOI substrate, a back control gate region, arranged under the channel region and configured to shift the threshold voltage of the transistor in response to bias voltages. This invention also provides patterns defining standard-cell-type circuit structures and data-path-cell type circuit structures that include arrays of the FET patterns provided by this invention. Such circuit structures also include back gate lines connecting the back gate control regions. This invention also provides methods of operating and designing such semiconductor device structures.

22 Claims, 12 Drawing Sheets

(56) References Cited

U.S. PATENT DOCUMENTS

| | | | | |
|---|---|---|---|---|
| 5,608,223 | A | 3/1997 | Hirokawa et al. | 250/447.11 |
| 5,646,900 | A | 7/1997 | Tsukude et al. | 365/205 |
| 5,753,923 | A | 5/1998 | Mera et al. | 250/443.1 |
| 5,844,845 | A | 12/1998 | Tahara | 365/189.05 |
| 5,869,872 | A | 2/1999 | Asai et al. | 257/360 |
| 5,889,293 | A | 3/1999 | Rutten et al. | 257/74 |
| 6,043,536 | A | 3/2000 | Numata et al. | 257/347 |
| 6,063,686 | A | 5/2000 | Masuda et al. | 438/406 |
| 6,072,217 | A | 6/2000 | Burr | 257/351 |
| 6,108,264 | A | 8/2000 | Takahashi et al. | 365/230.03 |
| 6,141,269 | A | 10/2000 | Shiomi et al. | 365/200 |
| 6,300,218 | B1 | 10/2001 | Cohen et al. | 438/423 |
| 6,372,600 | B1 | 4/2002 | Desko et al. | 438/406 |
| 6,476,462 | B2 | 11/2002 | Shimizu et al. | 257/627 |
| 6,498,057 | B1 | 12/2002 | Christensen et al. | 438/149 |
| 6,611,023 | B1 | 8/2003 | En et al. | 257/350 |
| 6,825,524 | B1 | 11/2004 | Ikehashi et al. | 257/314 |
| 7,109,532 | B1 | 9/2006 | Lee et al. | 257/133 |
| 7,112,997 | B1 * | 9/2006 | Liang et al. | 326/81 |
| 7,447,104 | B2 | 11/2008 | Leung | 365/230.06 |
| 7,449,922 | B1 | 11/2008 | Ricavy | 327/57 |
| 2001/0038299 | A1 | 11/2001 | Afghahi et al. | 326/86 |
| 2001/0047506 | A1 | 11/2001 | Houston | 716/4 |
| 2002/0105277 | A1 | 8/2002 | Tomita et al. | 315/111.81 |
| 2002/0114191 | A1 | 8/2002 | Iwata et al. | 365/185.23 |
| 2002/0185684 | A1 | 12/2002 | Campbell et al. | 257/347 |
| 2003/0001658 | A1 | 1/2003 | Matsumoto | 327/534 |
| 2004/0108532 | A1 | 6/2004 | Forbes | 257/296 |
| 2004/0146701 | A1 | 7/2004 | Taguchi | 428/209 |
| 2004/0197970 | A1 | 10/2004 | Komatsu | 438/163 |
| 2005/0077566 | A1 | 4/2005 | Zheng et al. | 257/315 |
| 2005/0110078 | A1 | 5/2005 | Shino | 257/331 |
| 2005/0255666 | A1 | 11/2005 | Yang | 438/401 |
| 2005/0276094 | A1 | 12/2005 | Yamaoka et al. | 365/154 |
| 2006/0013028 | A1 | 1/2006 | Sarin et al. | 365/49 |
| 2006/0013042 | A1 | 1/2006 | Forbes et al. | 365/185.08 |
| 2006/0035450 | A1 | 2/2006 | Frank et al. | 438/585 |
| 2006/0220085 | A1 | 10/2006 | Huo et al. | 257/296 |
| 2006/0226463 | A1 | 10/2006 | Forbes | 257/301 |
| 2006/0267064 | A1 | 11/2006 | Rosner et al. | 257/304 |
| 2006/0291321 | A1 | 12/2006 | Leung | 365/230.06 |
| 2007/0029596 | A1 | 2/2007 | Hazama | 257/296 |
| 2007/0029620 | A1 | 2/2007 | Nowak | 257/369 |
| 2007/0063284 | A1 | 3/2007 | Kawahara et al. | 257/351 |
| 2007/0075366 | A1 | 4/2007 | Hamamoto | 257/347 |
| 2007/0076467 | A1 | 4/2007 | Yamaoka et al. | 365/154 |
| 2007/0139072 | A1 | 6/2007 | Yamaoka et al. | 326/33 |
| 2007/0152736 | A1 | 7/2007 | Itoh et al. | 327/534 |
| 2007/0158583 | A1 | 7/2007 | Cho | 250/440.11 |
| 2007/0171748 | A1 | 7/2007 | Mukhopadhyay et al. | 365/208 |
| 2007/0241388 | A1 | 10/2007 | Yamamoto et al. | 257/314 |
| 2007/0298549 | A1 | 12/2007 | Jurczak et al. | 438/149 |
| 2008/0042187 | A1 | 2/2008 | Hwang | 257/316 |
| 2008/0111199 | A1 | 5/2008 | Kim et al. | 257/401 |
| 2008/0116939 | A1 | 5/2008 | Takizawa | 326/103 |
| 2008/0144365 | A1 | 6/2008 | Yamaoka et al. | 365/181 |
| 2008/0173916 | A1 | 7/2008 | Nishihara | 257/298 |
| 2008/0203403 | A1 | 8/2008 | Kawahara et al. | 257/80 |
| 2008/0251848 | A1 | 10/2008 | Borot et al. | 257/365 |
| 2008/0253159 | A1 | 10/2008 | Kajigaya | 365/51 |
| 2009/0003105 | A1 | 1/2009 | Itoh et al. | 365/203 |
| 2009/0010056 | A1 | 1/2009 | Kuo et al. | 365/184 |
| 2009/0086535 | A1 | 4/2009 | Ferrant et al. | 365/174 |
| 2009/0096011 | A1 | 4/2009 | Hong et al. | 257/321 |
| 2009/0096036 | A1 | 4/2009 | Ishigaki et al. | 257/392 |
| 2009/0096936 | A1 | 4/2009 | Hamada et al. | 348/731 |
| 2009/0101940 | A1 | 4/2009 | Barrows et al. | 257/204 |
| 2009/0111223 | A1 | 4/2009 | Wiatr et al. | 438/155 |
| 2009/0121269 | A1 | 5/2009 | Caillat et al. | 257/301 |
| 2009/0310431 | A1 | 12/2009 | Saito | 365/207 |
| 2010/0032761 | A1 | 2/2010 | Ding et al. | 257/350 |
| 2010/0035390 | A1 | 2/2010 | Ding et al. | 438/152 |
| 2010/0079169 | A1 | 4/2010 | Kim et al. | 326/120 |
| 2010/0117684 | A1 | 5/2010 | Kim et al. | 326/120 |

FOREIGN PATENT DOCUMENTS

| | | | |
|---|---|---|---|
| EP | 1 199 745 | A2 | 4/2002 |
| EP | 1 233 454 | A2 | 8/2002 |
| EP | 1 357 603 | A2 | 10/2003 |
| EP | 1 744 364 | A2 | 1/2007 |
| FR | 2 925 223 | | 6/2009 |
| JP | 04345064 | A | 12/1992 |
| JP | 08255846 | | 10/1996 |
| JP | 09232446 | | 9/1997 |
| JP | 10125064 | A | 5/1998 |
| JP | 2000196089 | A | 7/2000 |
| JP | 2004303499 | | 10/2004 |
| WO | WO 99/66559 | | 12/1999 |
| WO | WO 2007/060145 | A1 | 5/2007 |
| WO | WO 2008/134688 | A1 | 11/2008 |
| WO | WO 2009/013422 | A2 | 1/2009 |
| WO | WO 2009/028065 | A1 | 3/2009 |
| WO | WO 2009/077538 | A2 | 6/2009 |
| WO | WO 2009/085865 | A1 | 7/2009 |
| WO | WO 2009/104060 | A1 | 8/2009 |
| WO | WO 2010/007478 | A1 | 1/2010 |

OTHER PUBLICATIONS

U.S. Appl. No. 12/793,515, filed Jun. 3, 2010.
U.S. Appl. No. 12/789,100, filed May 27, 2010.
U.S. Appl. No. 12/886,421, filed Sep. 20, 2010.
U.S. Appl. No. 12/942,754, filed Nov. 9, 2010.
U.S. Appl. No. 12/961,293, filed Dec. 6, 2010.
U.S. Appl. No. 12/984,466, filed Jan. 4, 2011.
U.S. Appl. No. 13/007,483, filed Jan. 14, 2011.
European Search Report Application No. EP 10 29 0217 dated Sep. 15, 2010.
John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).
John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).
Paul Beckett, XP-002579039, "Performance Characteristics of a Nanoscale Double-gate Reconfigurable Array", Proc. Of SPIE, vol. 7268, pp. 72680E-1-72680E-12 (2008).
I. Hassoune et al. "Double-gate MOSFET Based Reconfigurable Cells", The Institution of Engineering and Technology, Electronics Letters, vol. 43, No. 23, 3 pages (2007).
K. Cheng, et al., "Extremely Thin SOI (ETSOI) CMOS with Record Low Variability for Low Power System-on-Chip Applications", IBM Research at Albany Nanotech, pp. 3.2.1-3.2.4( 2009).
P.J. Klim et al, "A 1 MB Cache Subsystem Prototype With 1.8 ns Embedded DRAMs in 45 nm SOI CMOS", IEEE, Journal of Solid-State Circuits, vol. 44, No. 4, pp. 1216-1226 (2009).
K. J. Kuhn, "Variation in 45nm and Implications for 32nm and Beyond", Intel, 2009 $2^{nd}$ International CMOS Variability Conference—London, pp. 1-86.
Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).
D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).
K. Itoh, et al., "Impact of FD-SOI on Deep-Sub-100-nm CMOS LSIs—A View of Memory Designers" Central Research Laboratory, Tokyo, Japan, 2 pages.
R. Kaushik, et al. "Double-Gate SOI Devices for Low-Power and High-Performance Applications", IEEE Computer Society, The British Library, IEEE Xplore, 8 pages, (2006).
M. Mizukami, et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).

M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).

S. Mukhopadhyay, et al., "A Novel High-Performance and Robust Sense Amplifier Using Independent Gate Control in Sub-50-nm Double-Gate MOSFET," IEEE Transactions on Very Large Scale Integration (VLSI) Systems, vol. 14, No. 2, pp. 183-192 (2006).

S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).

P. Nasalski, et al. "An Innovative sub-32nm SRAM Voltage Sense Amplifier in Double-Gate CMOS Insensitive to Process Variations and Transistor Mismatch" The 15th IEEE International Conference on Electronics, Circuits and Systems, pp. 554-557, (ICECS 2008).

P. Nasalski, et al. "SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).

T. Ohtou, et al. "Threshold-Voltage Control of AC Performance Degradation-Free FD SOI MOSFET With Extremely Thin BOX Using Variable Body-Factor Scheme", IEEE Transactions on Electron Devices, vol. 54, No. 2, pp. 301-307, (2007).

R. Tsuchiya, et al., "Silicon on Thin Box: A New Paradigm of The CMOSFET for Low-Power and High-Performance Application Featuring Wide-Range Back-Bias Control" 2004 IEEE, 4 pages.

R. Tsuchiya, et al., "Controllable Inverter Delay and Suppressing $V_{th}$ Fluctuation Technology in Silicon on Thin BOX Featuring Dual Back-Gate Bias Architecture," Central Research Laboratory, Tokyo, Japan, IEEE, pp. 475-478 (2007).

Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).

M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).

International Search Report, PCT/EP2011/052421 mailed May 26, 2011.

U.S. Appl. No. 12/880,806, filed Sep. 13, 2010.

U.S. Appl. No. 12/898,230, filed Oct. 5, 2010.

U.S. Appl. No. 12/946,135, filed Nov. 15, 2010.

U.S. Appl. No. 12/974,916, filed Dec. 21, 2010.

U.S. Appl. No. 12/974,822, filed Dec. 21, 2010.

U.S. Appl. No. 13/039,167, filed Mar. 2, 2011.

European Search Report Application No. EP 09290838.3 dated Feb. 16, 2010.

K. Roy, et al. "Double-Gate SOI Devices for Low-Power and High-Performance Applications", IEEE Computer Society, The British Library, IEEE Xplore, 8 pages, (2006).

M. Yamaoka, et al., "Dynamic-Vt Dual-Power-Supply SRAM Cell using D2G-SOI for Low-Power SoC Application," IEEE International SOI conference, Oct. 2004, pp. 109-111 (2004).

Ulicki, Bob et al., "De-Myth-tifying the SOI Floating Body Effect", SOI Industry Consortium, pp. 2-7 (2009).

European Search Report Application No. EP 10290181.6 dated Jan. 14, 2011.

* cited by examiner

DATA-PATH CELL ON AN SEOI SUBSTRATE WITH A BACK CONTROL GATE BENEATH THE INSULATING LAYER

CROSS-REFERENCE TO RELATED APPLICATIONS

This application is a continuation-in-part of application Ser. No. 12/961,293 filed Dec. 6, 2010 now U.S. Pat. No. 8,384,425 and also is a continuation-in-part of application Ser. No. 13/007,483 filed Jan. 14, 2011 now U.S. Pat. No. 8,432,216, the entire content of each of which is expressly incorporated herein by reference thereto.

FIELD OF THE INVENTION

The field of the invention relates generally to microelectronic devices, and more particularly to a semiconductor device produced on an SeOI (semiconductor on insulator) substrate comprising easily-fabricated standard cells or data-path cells with enhanced performance characteristics due to back control gate structures.

BACKGROUND OF THE INVENTION

Semiconductor device fabrication requires that lithographic structures be transferred onto a wafer. It has long been understood that to facilitate such transfer, it is desirable to simplify lithographic patterns. For example, the prior art recommends avoiding as far as possible corners in the same lithographic plane.

Use of different channel widths of transistors is a common practice. The channel length of an MOSFET transistor is at the present time typically around 30 nm, whereas its width (W) is typically much greater. The width determines the current intensity in the transistor for given source, drain and gate voltages. Therefore, it is usually desirable to design an electronic circuit with transistors having different channel widths.

But, in practice, fabrication of different widths with precision can be difficult because of the resolution limits of lithography. In fact, although it is relatively easy to produce long strip-like structures by lithography, short strips of very controlled dimensions are particularly difficult to fabricate.

US patent application 2008/0251848 teaches a fabrication process aimed at obviating inhomogeneities in performance between the various transistors of a circuit. To do so, this document proposes to make the influence of the environment on the various transistors uniform. More precisely, this document provides that an array of FET transistors be arranged in the form of long strips. The drain and source regions of any one strip then have the same dimensions, being spaced apart by gate regions of fixed dimensions. This document is further described below The resolution limit of the lithography tends to dictate the use of such long strips of transistors having identical dimensions. However, with long strips, the flexibility in designing electronic circuits is then lost since it is no longer possible to vary the geometric width of the various transistors so as to modulate their performance.

Transistors in digital integrated circuits are often organized into repeating patterns. In fact, the design of such integrated circuits is commonly based on integrating a plurality of elementary cells (similar cells often being stored together in a cell library) having predetermined logic functions. In general, two types of design may be distinguished.

According to the first type of design, an integrated circuit is constructed by selecting and interconnecting individual cells from a library comprising a large number, e.g., about a thousand, predesigned cells having simple functions, e.g., primitive Boolean logic functions (e.g., NAND, NOR and the like) and basic storage functions (e.g., latches, flip-flops and the like). Such cells providing simple functions and having simple implementation are often referred to as "standard cells".

According to the second type of design, the cells are selected from a cell library providing cells specifically adapted to a particular circuit environment for which they are intended. Such cells providing more specialized functions and having more complex implementations are often referred to as "data-path" cells. Although data-path cells can be implemented by interconnecting standard cells, they are usually designed from scratch. In a given circuit, the use of data-path cells specifically developed for the environment of that particular circuit makes it possible to achieve better performance characteristics (typically in terms of speed, power consumption and footprint). However, the design cost is higher.

Thus, data-path cells are typically used only for high-speed circuits, for circuits requiring optimized performance characteristics, and the like. For example, microprocessors can be constructed from as an interconnected network of data-path cells. Often such a network is organized as one or more data-paths, which are typically linear arrangements of data-path cells that provide conduits for the flow and transformation of data. Data-path cells often found in a microprocessor include computational cells (e.g., multiplexers, shifters, adders, multipliers, and the like) and state elements (e.g., sequential circuits such as latches, register files and so like).

It is well known in the field of microelectronic devices, the field of application of the present invention, that improvements in performance (speed, power consumption and the like) and miniaturization are ongoing requirements. However, it is also well known that miniaturization can lead to problematic performance effects due to, e.g., short channel effects, small channel volume effects, and the like, and to the problematic fabrication effects already discussed that are due to, e.g., irregularities in photolithography of highly miniaturized patterns.

Accordingly, there is a need in the art for data-path cells that overcome such problems of miniaturization and provide improved performance and size characteristics and more reliable and simpler fabrication.

SUMMARY OF THE INVENTION

The present invention provides devices and methods that obviate the variability inherent in lithographic pattern transfer, in particular, random variability due to the structuring of the lines leading to line/space/line variability. The present invention also simplifies lithography and saves wafer space by avoiding the need for shallow trench isolation (STI) and by tightening up the rules governing transistor structures (e.g., active zones, gate lines, interconnect lines, etc.). More specifically, this invention provides semiconductor device structures fabricated by lithography that are more regular and denser.

According to a first embodiment, this invention provides a semiconductor device structure formed on a semiconductor-on-insulator (SeOI) substrate (known to comprise a thin film of semiconductor material separated from a base substrate by an insulating film) including an array of patterns, each pattern defining at least one field-effect transistor having, in the thin semiconductor film, a source region, a drain region, a channel region (the channel region being delimited by the source and drain regions), and a front control gate region formed above the channel region. The patterns of the source and drain regions are arranged in the form of rows, having the same dimensions (e.g., widths transverse to a row) and spaced apart by front control gate regions of fixed dimensions (e.g., lengths longitudinal to a row).

Significantly, the provided device structure further includes at least one pattern defining a FET transistor with a back control gate region formed in the base substrate beneath the channel region (e.g., underlying the channel region). This back gate region is configured so that, when biased, the threshold voltage of the transistor is shifted. Such a shift simulates a modification in the channel width of the transistor (e.g., determining an effective channel width different from the actual channel width), can force the transistor to remain off or on whatever the voltage applied on its front control gate, can change the transistor's performance characteristics, and so forth. Although the invention finds its principal applications to field-effect transistors, it is also applicable to other similar types of transistors.

Certain preferred, but non-limiting, aspects of this device structure are the following:
- Some of the patterns in a row can be formed on one and the same active zone of the thin semiconductor film of the SeOI substrate;
- An isolation region can delimit the adjacent patterns, which can further include a front isolation gate formed above the active zone and a back isolation gate formed in the base substrate beneath the active zone, and, when in an OFF state, can isolate transistors adjacent to the isolation region on either side;
- A back isolation line can connect the back isolation gates of each of the isolation regions of any one row, or can be connected to a bias potential to bring the isolation region to an OFF state;
- This back isolation line can be common to several rows;
- The back isolation gate can have a conductivity of opposite type to that of the active zone;
- A back gate line can connect the back gate region(s) (or isolation regions or both) of only one or of two or more transistors.
- A back gate line can connect the back gate region(s) (or isolation regions or both) to ground or to a nominal supply voltage;
- A back gate line can connects the back gate region(s) to an analog and (preferably, continuously) adjustable potential;
- The back gate region (and an isolation region) can be isolated from the base substrate by a well of opposite conductivity; and
- the channel regions, the front control gate regions and the back-control-gate regions of the FETs are sized and configured so that the associated FETs have a selected combination of reduced footprint and increased performance when compared to similar FETs without any back-control-gate regions.

The present invention also provides circuit structures, e.g., standard-cell-like circuit structures, data-path-cell-like circuit structures, and the like, comprising devices of this invention that overcome miniaturization problems so as to provide improved performance and reduced size. Preferably, the devices are arranged in rows, arrays or other regular patterns.

Certain preferred, but non-limiting, features of the provided cells include the following:
- a back gate line that connects the back gate regions of a plurality of transistors;
- a back gate line that extends into the bulk substrate beneath the insulating layer along a row of transistors;
- a back gate region that is isolated from the bulk substrate by a well of opposite conductivity type;
- a back gate region with a conductivity of the same (or of the opposite) type as that of the channel of the associated transistor;
- the cell is configured with an input and an output stage of one or more FETs;
- a back-control-gate line connects to the back-control-gate regions of the FETs of the input stage, or to the back-control-gate regions of the FETs of the output stage, or to the back-control-gate regions of the FETs of both the input and the output stages;
- back-gate lines connecting to bias sources that bias back-control-gate regions of the FETs of the output stage of a data-path cell so as to increase conduction currents in the ON state;
- back-gate lines connecting to bias sources that bias back-control-gate regions of the FETs of the input stage of a data-path cell so as to decrease leakage currents in the OFF state; and
- one or more back-control-gate lines of a data-path cell connect to the back-control-gate regions of FETs of input stages or to back-control-gate regions of FETs of output stages.

Further preferred embodiments of the invention provide integrated circuits produced on a SeOI substrate and comprising one or more of the data-path cells of the invention. Certain preferred, but non-limiting, features of the provided integrated circuits include the following:
- the data-path cells are arranged in a regular array, e.g., a rectangular array;
- the circuit is configured with one or more rows of cells along a first direction so that the output of a particular data-path cell connect to inputs of at least one succeeding data-path cell along the row.;
- the circuit is configured with a plurality of rows of data-path cells along a first direction, and wherein the rows are arranged parallel to one another along a different second direction; and
- one or more back-control-gate lines connect to the back-control-gate regions of some or all of the FETs in the data-path cells arranged along the first direction or along the second direction.

According to a second embodiment, this invention provides methods of operating and designing devices of this invention and circuit structures comprising such devices. According to one method of operating a device of this invention, the back control gate region one or more transistors is biased positively or negatively, preferably by an analog and (preferably, continuously) adjustable potential or by a ground potential or by a nominal supply voltage, in order to shift the threshold voltage of those transistors.

According to a further method of operating a device structure of this invention, the biasing is controlled so that the shift of the threshold voltage is sufficient to cause the transistor to remain off or on whatever the voltage applied to its front control gate.

According to a further method of operating a device structure of this invention, the back gate region is biased to a first potential when the transistor is in the off-state (according to the front control gate) and is biased to a second potential when the transistor is in the on-state (according to the front control gate).

According to one method of designing circuit structures comprising devices of this invention, the circuit structures are specifically adapted to their environments for use in integrated circuits produced on semiconductor-on-insulator substrates by performing steps including:

reducing the physical width of a transistor (FET) of the cell, in order to decrease the capacitance thereof; and adding a back control gate to the transistor (FET), said gate being placed in the bulk substrate, in order to increase the conductance thereof when in use in an on-state.

According to another method of designing data-path cells to have determined footprints and performances where the FETs of the array are arranged in one or more rows where the FETs of a row all have source, channel and drain regions of the same width arranged along the row, the steps include:

selecting the widths of the FET rows so that the cell has no more than the determined footprint, the footprint depending at least in part on the widths of the FET rows; and positioning back-control-gate regions beneath selected FETs and selecting the bias voltages for the provided regions so that the cell has at least the determined performance, the performance depending at least in part on the capacitances and conductance of the FETS wherein the capacitance and conductance vary with the widths of the FETs, the provided back-control-gate regions and their biases.

Certain preferred, but non-limiting, features of these methods of designing data-path cells include, in comparison to a benchmark data-path cell having initial FET row widths but without back-gate-control regions:

the determined footprint is reduced and the determined performance is not reduced;

the determined footprint is not increased and the determined performance is increased;

the determined footprint is reduced and the determined performance is increased;

the FET capacitances are reduced by up to about 33% and FET conductance are not reduced;

an operating speed is increased about 20% and the footprint is reduced about 20%;

a power consumption is reduced about 20% and the footprint is reduced about 20%; and an operating speed is increased between about 30 and 50% and the footprint is not increased.

The present invention is described herein for convenience in terms of "rows" and "columns" that reflect a particular and conventional geometric orientation. It should be understood that this invention is independent of this particular orientation, and that this orientation can be arbitrarily rotated without changing the nature of the invention. For example, the term of "row" as used herein could be replaced with the term "column," and the term of "column" used herein could be replaced with the term "row."

Certain terms are used herein with the following definitions. The term "substantially" is used to mean a result that is complete except for the deficiencies normally expected in the art. Also, the description of a range is understood to also include description of all specific values within the described range Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

The following describes, in order, principles of the devices of the invention, advantages of these devices, application of these device to standard-cell-like circuit structures, application of these device to data-path-cell-like circuit structures, and methods of operating these circuit structures. This arrangement of the detailed description and the accompanying headings are for clarity of presentation only and without limitation of the scope of the invention.

The Principle of the Devices of the Invention

The present invention is advantageously applied to circuit structures (e.g., standard cells, data-path cells, entire integrated circuits comprising a plurality of standard or data-path cells) comprising a plurality of field-effect transistors (FET) that are fabricated onto a conventional SeOI substrate (comprising a thin film of semiconductor material separated from a base substrate by an insulating film) and have a uniform environment and common performance characteristics. Specifically, the present invention provides a back control gate for at least one FET of such circuit structures where the back control gate is formed in the base substrate facing the channel of the at least one transistor. By biasing the back control gate of the at least one transistor positively or negatively (typically to a potential or voltage between $+V_{DD}$ and $-V_{DD}$), the properties of this transistor may be individually modified. In particular, the threshold voltage of this transistor may be shifted. Modifying the threshold voltage is known to be equivalent to modifying the physical width of the transistor's channel.

Figure 1:
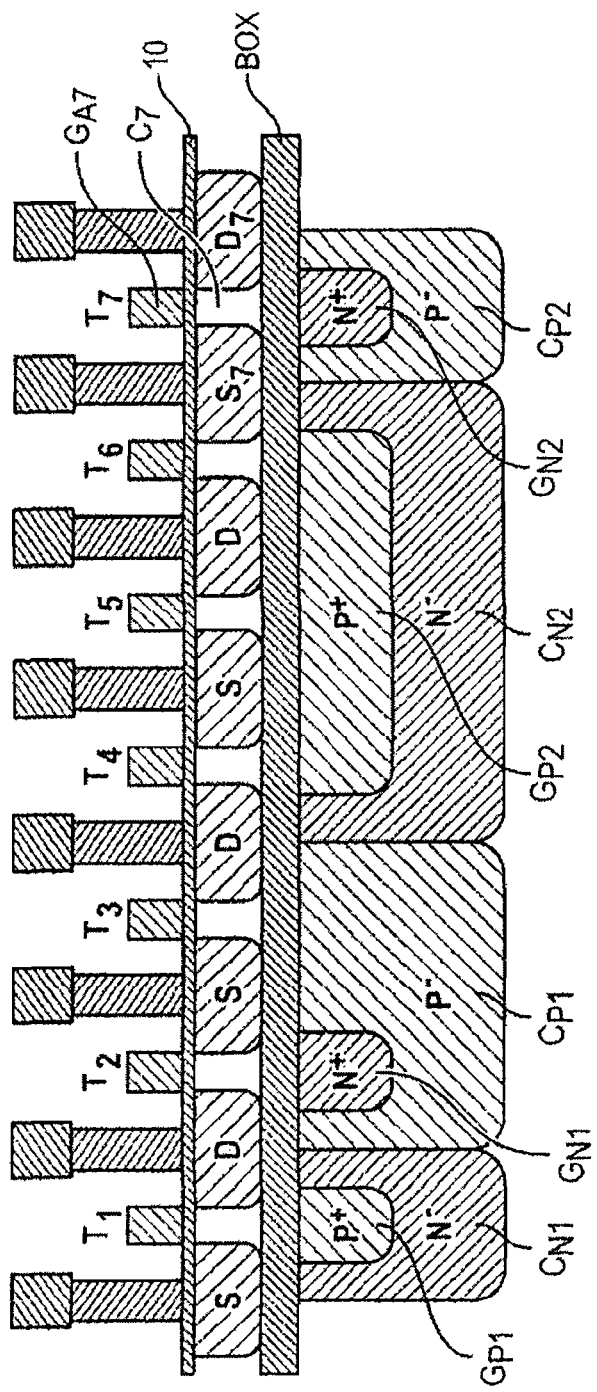
FIG. 1 illustrates possible structures of several back control gates of the invention.

In the following, the structures and actions of back control gates are described. Concerning the structures of back control gates, FIG. 1 is an exemplary illustration of a row of nMOS transistors $T_1$-$T_7$ produced on an SeOI substrate with back-control-gates according to this invention. For the sake of clarity only, these transistors have the same dimensions. In this sectional view, the insulating layer bears the reference BOX (buried oxide). The source, drain and channel regions are within the thin semiconductor layer above the insulating layer BOX, and the front control gates are above the channel regions separated therefrom by a gate dielectric layer.

In this figure, the channels of the transistors are fully depleted, the source regions S and the drain regions D both being in contact with the insulating layer BOX. However, the invention also extends to partially depleted technology in which the source region and the drain region do not extend right into the thin layer. In this case, it should be noted that the back control gate is overall less effective in controlling such an FET as it is spaced further from the channel region between the source and drain regions.

FIG. 1 is not limiting, and in practice, the transistors of the circuit structures of this invention are not necessarily arranged in rows; they do not necessarily have the same dimensions (including along a given row); they may have an individual back control gate or a common back control gate; the potential applied to the back control gates may or may not be different; etc.

Referring to the transistor $T_7$, this transistor has, in the thin layer of the SeOI substrate, a source region $S_7$, a drain region $D_7$ and a channel region $C_7$ lying between the source and the drain. The transistor $T_7$ further includes a (first) front control gate region $G_{A7}$ conventionally placed in a manner known per se above the channel, a gate dielectric layer 10 being interposed between the front control gate $G_{A7}$ and the channel $C_7$.

The transistor $T_7$ further includes a second gate, namely, back control gate $G_{N2}$, placed in the bulk substrate and separated from the channel $C_7$ by the insulating layer BOX. The back control gate $G_{N2}$ can be used for, e.g., increasing the conduction of the transistor without having to increase the dimensions thereof. The back control gate can be, for example, formed by implanting dopants beneath the insulating layer BOX.

FIG. 1 illustrates some of the variations that are within the scope of this invention. In FIG. 1:
the transistor $T_1$ has a back control gate $G_{P1}$ of $p^+$-type;
the transistor $T_2$ has a back control gate $G_{N1}$ of $n^+$-type;
the transistor $T_3$ has no back control gate;
the transistors $T_4$-$T_6$ have a common back control gate $G_{P2}$ of $p^+$-type; and
the transistor $T_7$ has a back control gate $G_{N2}$ of $n^+$-type.

FIG. 1 illustrates that a back control gate can be associated individually with a particular transistor, in which case it can be located in the bulk substrate beneath the insulating layer so as to extend only facing the channel of the associated transistor (cf. transistors $T_1$, $T_2$ and $T_7$). Alternatively, a back control gate may be common to a plurality of transistors. Such a common back control gate can lie in the bulk substrate beneath the insulating layer under the channels of said plurality of transistors (in the case of the transistors $T_4$-$T_6$).

Back control gates are preferably isolated from the bulk substrate by a well, e.g., $G_{N1}$, $C_{P1}$, $C_{N2}$, $C_{P2}$, of opposite conductivity type (n-type well $C_{N1}$, $C_{N2}$ for a $p^+$-type back control gate $G_{P1}$, $G_{P2}$; $p^-$-type well $C_{P1}$, $C_{P2}$ for an $n^+$-type back control gate $G_{N1}$, $G_{N2}$). The well voltage is preferably chosen so that the parasitic diode created between the back control gate and the surrounding well is reverse-biased. If reverse-biased, such a diode isolates the back control gate from the well and its contents (especially other back control gates). Alternatively, a single well common to several back control gates of the same type can be provided.

As an alternative or in addition to the wells, a second insulating layer, based in the bulk substrate beneath the insulating layer BOX, may also contribute, completely or partly, to isolating a back control gate from the bulk substrate. As a further alternative or in addition to the wells, lateral isolation regions extending beneath the insulating layer BOX and depthwise into the bulk substrate can be provided so as to isolate the back control gate from the bulk substrate. In such a situation, the back control gate does not have to be precisely located facing the channel of a transistor.

Concerning now the operation of back control gates, importantly, the doping properties and biasing of back control gates can shift the threshold voltage (represented by $V_{th}$ in the following) of the associated transistor (FET). Summarizing, the type of doping of the back control gate associated with a transistor can or can not shift the nominal threshold voltage (represented by $V_{t0}$ in the following); also the bias of the back control gate (represented by $V_{BG}$ in the following) can or can not shift the threshold voltage. Thus, transistors of this invention can have increased conduction current $I_{ON}$ in the on-state of the transistor (by reducing the threshold voltage), and reduced leakage current $I_{OFF}$ in the off-state of the transistor (by increasing the threshold voltage).

Considering the nominal threshold voltage, this voltage is known to depend on the work function. A transistor in which the channel is of n-type conductivity and a back control gate is of p-type conductivity has a very high threshold voltage. This threshold voltage may then be reduced by applying a positive voltage to the back control gate. In the present description, such a back control gate is said to have a work function.

A transistor in which the channel is of n-type conductivity and a back control gate is of n-type conductivity has a nominal threshold voltage (that is, a threshold voltage expected for a transistor of this type and configuration). This threshold voltage can be reduced by applying a positive voltage to the back control gate. In the present description, such a back control gate is said to have no work function.

Considering the biasing of back control gates, cy biasing the back control gate of a transistor positively or negatively (typically by +0.3 V or −0.3 V), the properties of the associated transistor may be individually modified. In particular, the threshold voltage of the transistor may be shifted or modified, which is, as well known, equivalent to modifying the physical width of the channel of the transistor. Thus, even if the physical width of the channel of a transistor is defined once-for-all during fabrication, this invention makes it possible to modify the apparent (effective) width of such a channel by choosing the way in which the back control gate is biased or driven. Also, since the voltage applied to the back control gate may be modified, the invention thus offers the advantage of modifying the effective channel width dynamically.

This variation in the threshold voltage of the transistor via the back control gate may be formulated as $V_{th}=V_{t0}-\alpha V_{BG}$, where $V_{th}$ represents the threshold voltage of the transistor, $V_{BG}$ represents the voltage applied to the back control gate, $V_{t0}$ represents the nominal threshold voltage (which may be shifted by the work function depending on whether a back control gate of n-type or p-type is used) and a represents a factor associated with the geometry of the transistor.

It will therefore be understood that the doping type of the back control gate associated with a transistor may or may not shift the nominal threshold voltage, but that by biasing the back control gate it is possible to adjust the threshold voltage. It is thus possible to benefit from an increase in the conduction current $I_{ON}$ in the on-state of the transistor (by reducing the threshold voltage) and from a reduction in the small leakage current $I_{OFF}$ in the off-state of the transistor (by increasing the threshold voltage). A contribution may also be made to the isolating function of an isolation region separating the adjacent patterns along a row by reducing the leakage current therein.

As presented in the thesis "Architectures innovantes de mémoire non-volative embarquée sur film mince de silicium [Innovative non-volatile memory architectures on thin silicon films]" defended by Germain Bossu in June 2009 at the Provence, Aix-Marseille University I, the factor a may in particular be approximated as $\alpha=3t_{ox1}/(t_{Si}+3t_{ox2})$, where $t_{ox1}$ denotes the thickness of the dielectric gate film separating the front control gate from the channel (typically 1-2 nm), $t_{ox2}$ denotes the thickness of the insulating film separating the back control gate from the channel (typically 5-20 nm for SeOI substrates) and $t_{Si}$ denotes the thickness of the thin semiconductor film.

Figure 2:
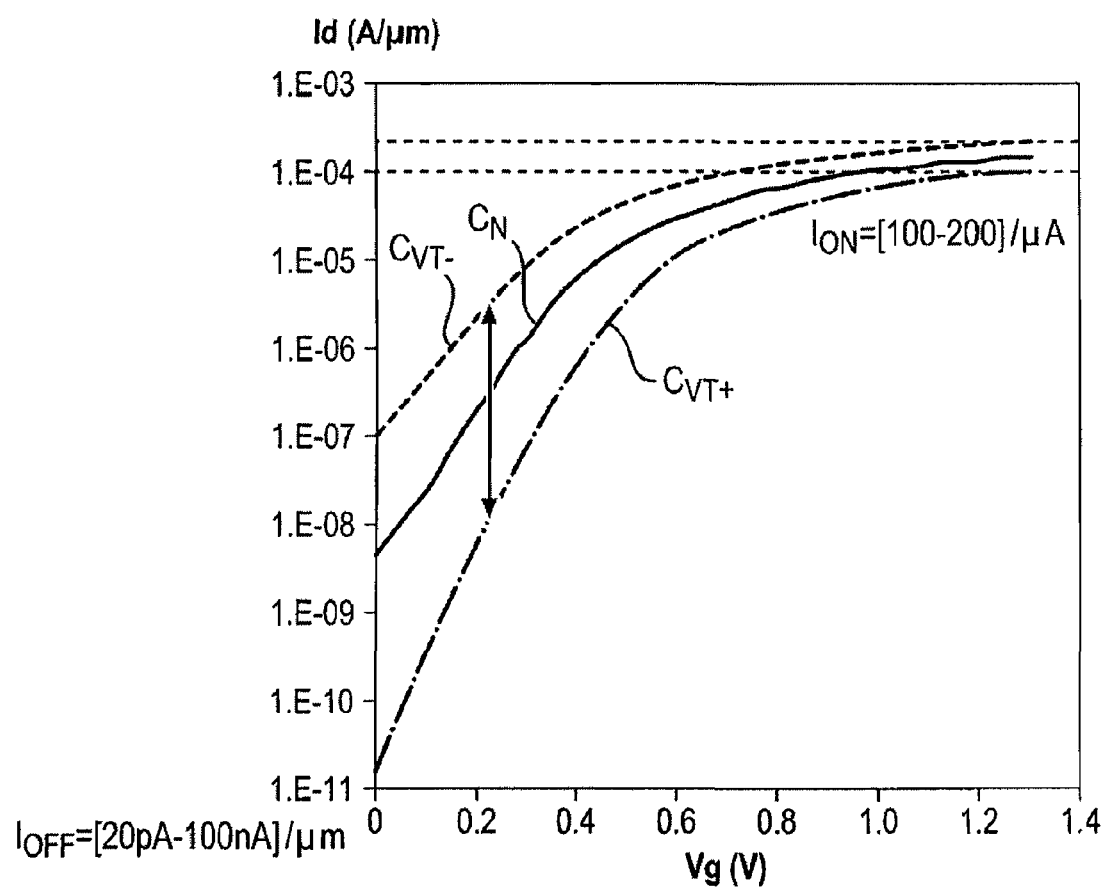
FIG. 2 illustrates control of the threshold voltage of a FET transistor by biasing a back control gate.

In more detail, FIG. 2 illustrates the control of the threshold voltage of a transistor produced on a SeOI substrate by biasing a back control gate fabricated in the base substrate, beneath the insulating film and facing the channel of the transistor. In this figure, the central curve $C_N$ represents the nominal characteristic $\log(I_D(V_G))$ (for a transistor with no back control gate).

The upper curve $C_{VT-}$ (that is, C with subscript VT-) represents the characteristic $\log(I_D(V_G))$ under the effect of a back control gate driven with a voltage below the nominal supply voltage $V_{DD}$ of the circuit. This upper curve illustrates the increase in the threshold voltage and the reduction in the currents $I_{ON}$ and $I_{OFF}$. The lower curve $C_{VT+}$ (that is, C with subscript VT+) represents the characteristic $\log(I_D(V_G))$ under the effect of a back control gate driven with a nominal supply voltage $V_{DD}$. This lower curve illustrates the reduction in the threshold voltage and the increase in the currents $I_{ON}$ and $I_{OFF}$.

It will thus be understood that, by varying the back control gate bias, it is possible to cover the entire area between the lower curve $C_{VT-}$ and the upper curve $C_{VT+}$, thus modulating the threshold voltage of the transistor and its characteristic currents $I_{ON}$ and $I_{OFF}$.

The following equation links in particular the current $I_D$ in the channel to the channel width W and to the threshold voltage $V_{th}$:

$$I_D = \frac{\mu_n C_{ox} W}{2L}(V_{GS} - V_{th})^2(1 + \lambda V_{DS}).$$

Consider a first example in which the gate and drain voltages are 0.9 V ($V_{GS}=V_{DS}=0.9$ V), with $\lambda=0.05$, and the threshold voltage is $V_{th}=0.3$ V. By modifying the threshold voltage of the transistor so that it takes a value between 0.05 V and 0.6 V, it is then possible to simulate a modification in the physical width of the channel (at fixed $I_D$). Theoretically, the effective width of the transistor channel can be modified between 0.25 and 2.01 times the physical width ($W_0$) of the channel.

Consider a second example with lower gate and drain voltages, namely 0.7 V, and further consider again modifying the threshold voltage of the transistor so that it takes a value between 0.05 V and 0.6 V. Then, the effective width of the channel can be theoretically modified between 0.06 and 2.64 times the physical width of the channel The invention thus allows a reduction/increase of the effective channel width. This control is particularly important when the supply voltages are low. In this regard, since the tendency in the technical field of the invention is for future generations of electronic components to use ever lower supply voltages, this invention can become, a priori, even more significant for such future generations.

Advantages of the Invention

A device according to the invention has the following advantages. A wide performance range may be obtained for the p-FET and n-FET transistors while using only a single physical channel width. Typically, three types of performance are the following:

regular performance, in the absence of a back control gate: the transistor is then an ordinary SeOI transistor and it is unnecessary to modify the existing circuit designs;

boosted performance, with an "ON" back control gate, increasing the conduction of the transistor:
the transistor then operates as if it were wider than it actually is, or it has a smaller footprint per performance unit (speed, $I_{ON}$); and reduced performance, with an "OFF" back control gate, reducing the conduction of the transistor:
the transistor then operates as if it were narrower than it actually is. This may prove to be advantageous when performance ratios are desired (in the case of latches, for example, of the flip-flop type) since it is therefore unnecessary to widen another device. The leakage currents are also significantly reduced. This type of performance may thus be used in the off-states so that, in so far as no transistor switches (no ratio to be respected), the leakage current $I_{OFF}$ then being reduced.

However, the invention is in no way limited to these three types of performance. Indeed, the performance characteristics can be dynamically modulated by applying an analog and (preferably, continuously) adjustable bias to the back control gate of a transistor. Any kind of performance in between the above mentioned "reduced performance" and the "boosted performance" can therefore be achieved.

In a particular variant, the back control gate may be biased by any one of multiple predefined voltages. These multiple voltages are typically voltages that are available in the environment of the device, such as Vdd, various multiples or fractions of Vdd (such as Vdd*2, Vdd/4) and various combinations of available voltages (such as Vdd-Vtp, Vdd-Vtn, etc.). Thereby, the ratios between the pFET and nFET transistors may be adjusted without having to modify the channel width.

Thus, it will be understood that a device structure according to the invention obviates the needs encountered in the conventional designs for transistors having different dimensions. Effectively only a single physical width and simplified transistor models and parameters are used. It should be pointed out that the transistor models are actually complex equations with many secondary (parasitic) or tertiary edge effects. Most of these effects depend on the dimensions of the transistor and, for recent technologies, the environment (proximity stress). In this invention, a single topology can be used, and the models can then be greatly simplified (this results in more rapid availability, shorter development times, etc.).

Moreover, a device structure of this invention can have a very low variability because of the high level of regularity, and because only the polysilicon roughness remains, and because, when fully depleted structures are produced, fluctuation in the level of dopants disappears.

Moreover, a device structure of this invention can also be insensitive to edge rounding effects of patterns because all the channels have the same physical width. The active zone strip is effectively a long polygon, having no rounding near a polysilicon connection line. The 90° corner of such a line is also far from the active strip (both at the top and the bottom of the structure) and does not interact with the active strip.

Moreover, a device structure of this invention can be insensitive to cross-coupling effects. This is because, in conventional designs, it often happens that a polysilicon connection is adjacent to a drain of another logic gate. The two nodes are then capacitively coupled and mutually disturbed, generally resulting in communication delays. Since the status of the neighboring cells is unpredictable, this coupling cannot be taken into account in the model of each cell and is therefore discovered relatively late in the design of the application. In this invention, the interaction between active strip and polysilicon connection is the same whatever the status of the neighboring cells, thereby resolving this drawback encountered in conventional designs. In particular, the modeling of the coupling remains valid after circuit production.

Moreover, a device structure of this invention can have a reduced power consumption because of the association of back control gates with the isolation regions, which reduces leakage currents therein. There is the further possibility of dynamically acting on the back control gates associated with the transistors in their off-state, in order to further reduce the leakage currents.

To illustrate the effectiveness of the invention, it will be recalled that a standard CMOS cell library may comprise twelve inverters having different performance characteristics. The invention makes it possible, when applied in fully-depleted technology, to use only three inverters ($INV_1$, $INV_4$ and $INV_8$), because the effective channel width may be modulated between +/−50% of the physical width. In partially-depleted technology, only four inverters are necessary ($INV_1$, $INV_4$, $INV_6$ and $INV_9$), because the effective channel width may be modulated between +/−30% of the physical width. It follows that the standard cell library is considerably simplified—in fact it can be generally reduced by a factor of 2. Thus, although around a hundred design rules are used today, the invention makes it possible for only around fifty of to actually be used.

It should be noted in this regard that, in the past, the design rule manual contained approximately 100-200 rules. Since technologies are now generally below 100 nm, many physical effects are appearing that are resulting in new rules that prevent the simple and easy application of the initial set of 100-200 rules. At the 32 nm technology node, the design rule manual comprises about 800 to 1000 rules, in which most of the new rules are complex descriptions of difficult combinations of topologies. This entails a loss of efficiency in terms of footprint. In contrast, the efficiency of the invention remains generally constant across technology line sizes. Thus, if the invention and a conventional approach are generally equivalent in terms of footprint used at the 45 nm node, the invention will become increasingly more efficient at subsequent technology nodes.

Moreover, in so far as the set of design rules used in this invention can be a reduced subset of the usual set of rules, and because each of the rules used are applied in a single and unique context, it proves possible to design transistors below what the lithography might initially by presumed to permit. In particular, it is possible to optimize the width of contacts (for example by replacing two nominal square contacts by a single rectangular, and somewhat narrower, contact), and also to optimize the poly-contact distance.

Moreover, it should be noted that the back control gates have the advantage of being buried beneath the insulating film and consequently have no impact on the footprint. It should also be pointed out that the footprint may be reduced by about 10 to 15% since it is possible to generate strong conduction with the aid of cells "boosted" in accordance with the invention. Finally, it should be noted that the extreme regularity of (what is called) the "front-end" structure of the transistors is particularly suitable for the normal use of (what are called) "back-end" metallization for (what are called) "standard" cells (i.e. cells predesigned for general usage).

This is because standard cells are interconnected (routed) together via metallization levels that are alternately horizontal and vertical with a constant pitch. The reduction in number of design rules enormously facilitates the closing-off of the front-end and back-end constraints (the transistor repeat pitch and the routing pitch are made identical). The usage of standard cells then becomes easier since—by construction—the inputs/outputs are placed on the metal routing grid. In the conventional case, this is not always very easy and it is necessary in particular to take into account the possibility of reflecting the cells along the vertical and/or horizontal axes. However, keeping the inputs/outputs on the routing grid often means increasing the footprint of the standard cell. In the case of the invention, all these considerations are eliminated through the general simplification and pre-placement of the strips of transistors.

Application to Standard-Cell-Like Exemplary Circuit Structures

Figure 3:
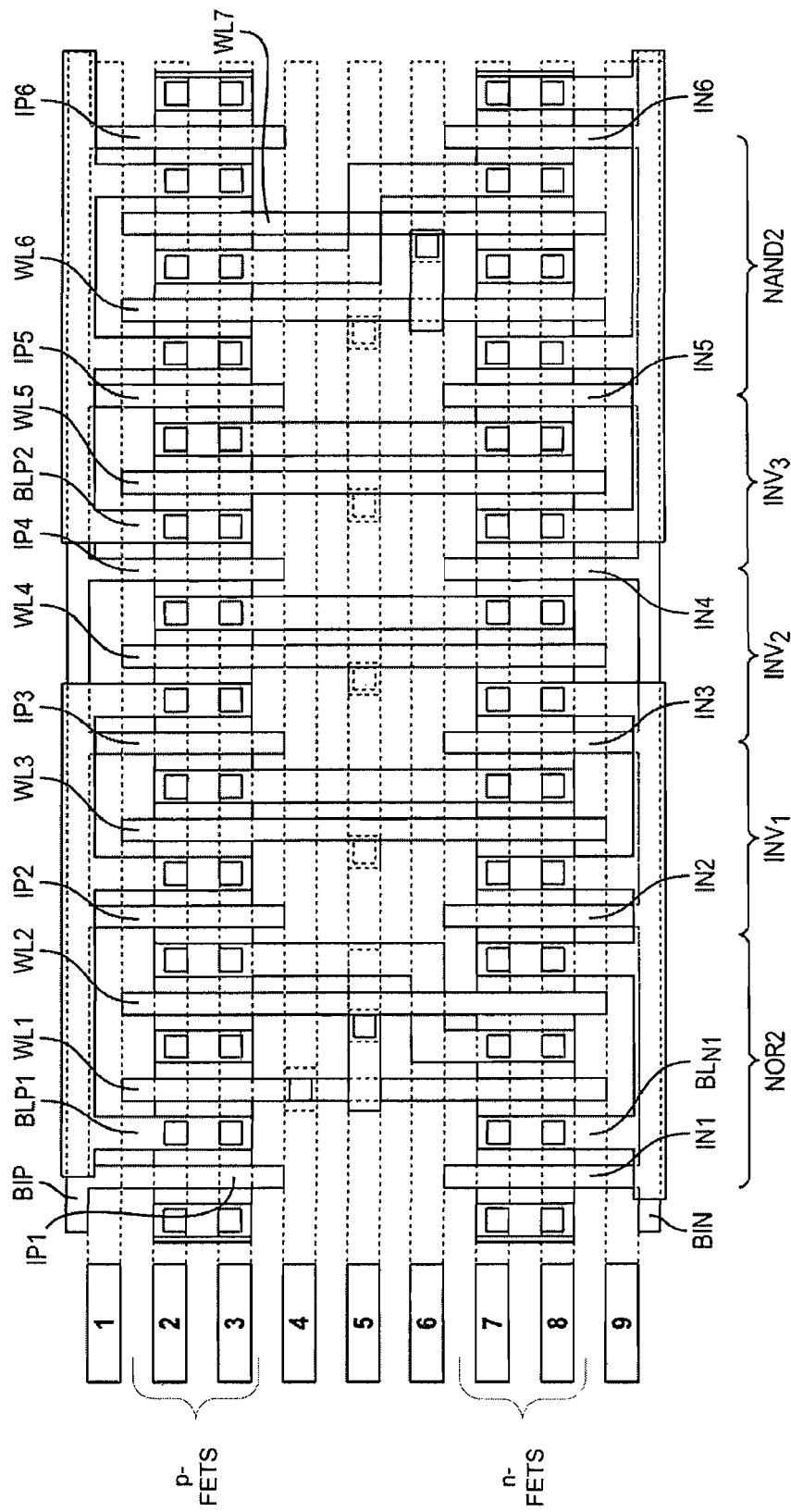
FIG. 3 illustrates exemplary circuit.

How the present invention can be applied to the exemplary CMOS electronic circuit structure illustrated in FIG. 3 is now described. This circuit can be considered as a linear array (e.g. a row) of patterns, each pattern representing what could be called a standard cell. Specifically the standard cells are a logic gate NOR2, three inverters $INV_1$, $INV_2$ and $INV_3$ and a logic gate NAND2. Each standard cell pattern defines a plurality of field-effect transistors. The FETs defined by the standard cell patterns are arranged in rows with the source and drain regions of each transistor of any one row having the same dimensions and being spaced apart by front control gate regions (WL1-WL7) of fixed dimensions. The channel width of the various transistors is then uniform, defined by the section between two perpendicular strips.

Alternatively, the entire circuit structure can be considered as an array of FETs, the array representing a single data-path cell (if the individual patterns were appropriately interconnected). Here, the FETs are arranged in rows again with the source and drain regions of each transistor of any one row having the same dimensions and being spaced apart by front control gate regions of fixed dimensions.

More precisely and however considered, the exemplary circuit comprises nine metal busses, the p-FET transistors being arranged along busses 2 and 3 whereas the n-FET transistors are arranged along busses 7 and 8. Busses 4 to 6 are used to make the input/output connection to these patterns and to connect these various patterns together. It is clear that other combinations are possible, with 8 to 12 metal busses being a reasonably possible number of busses. These metal busses are preferably at metal interconnect level 2 according to device technologies known in the art, and are referred to also as "metal2" busses. Herein, metal busses are preferably at interconnect level 2 unless otherwise specified.

Metal (preferably at interconnect level 1, or "metal1") supply lines $BL_{P1}$, $BL_{P2}$, $BL_{N1}$, $BL_{N2}$ of this exemplary circuit serve to fix the potential of some of the drain regions of the transistors. The lines $BL_{P1}$ and $BL_{P2}$ are used typically to deliver a nominal supply voltage, $V_{DD}$, whereas the lines $BL_{N1}$ and $BL_{N2}$ are typically connected to ground, GND. Thus, the drain of the first p-FET transistor of the logic gate NOR2 and the drain of the p-FET transistors of the inverters $INV_1$ and $INV_2$ are connected to the line $BL_{P1}$, whereas the drain of the p-FET transistor of the inverter $INV_3$ and the drain of the p-FET transistors of the logic gate NAND2 are connected to the line $BL_{P2}$. The drain of the n-FET transistors of the logic gate NOR2 and the drain of the n-FET transistors of the inverters $INV_1$ and $INV_2$ are connected to the line $BL_{N1}$, whereas the drain of the n-FET transistor of the inverter $INV_3$ and the drain of the first n-FET transistor of the logic gate NAND2 are connected to the line $BL_{N2}$.

The patterns along a row of this exemplary circuit are formed on one and the same active zone of the substrate, and therefore isolation regions are provided between adjacent patterns. These isolation regions, each having a front isolation gate formed above the active zone, bear, in what follows, the references $I_{P1}$-$I_{P6}$ for the isolation regions linked to the p-FET transistors and the references $I_{N1}$-$I_{N6}$ for the isolation regions linked to the n-FET transistors. The front isolation gates of the isolation regions are biased by means of isolation gate supply lines $BI_P$ and $BI_N$ for the isolation regions between p-FET patterns and between n-FET patterns, respectively. These lines $BI_P$ and $BI_N$ are typically formed from a polycrystalline semiconductor material (typically polycrystalline silicon).

FIGS. 4 to 7 illustrate exemplary layouts of back gate regions (both back-control-gate regions and back-isolation-gate regions) and back gate lines (both back-control-gate lines and back-isolation lines) in the bulk substrate (here forming a single active zone) beneath the insulating oxide layer of a circuit similar to that in FIG. 1 according to various examples of the invention. FIG. 8 shows a preferred layout.

In FIGS. 4-8, the back control/isolation gate lines are represented by the symbols $BG_{XYZ}$, where; X is P or N for p-type conductivity or n-type conductivity, respectively; Y is H, L or A for a high-level, a low-level or an analog-level, respectively; and Z is a number identifying different similar back control/isolation lines. Although not illustrated, the back-gate lines are connected to sources of selected bias voltages, e.g., –Vdd, ground, Vdd, and the like. These connections are typically made by vias connecting the back-gate lines to metal lines distributing the selected bias voltages. Alternatively, the back-gate lines can be driven by dedicate FETs.

The FETs are represented as enhancement mode devices so the channel conductivity is the opposite of the transistor type. For example, p-type FETs have channel conductivity of the p-type (the majority carriers of the drain and source regions) although the channel material is of n-type, and conversely for n-type FETs. This is not limiting, and the invention is also applicable to depletion mode devices.

Figure 4:
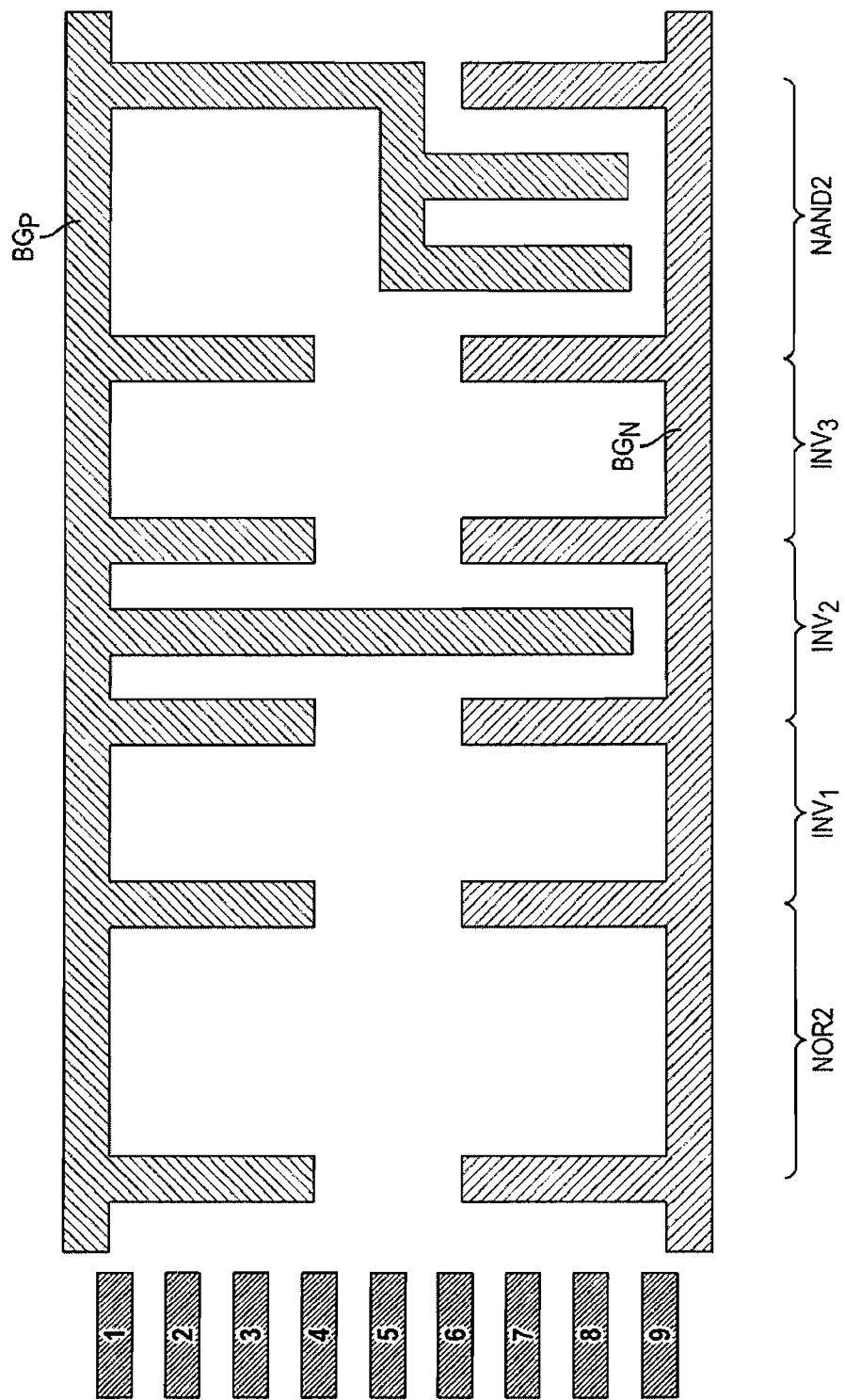
FIGS. 4 to 8 illustrate various exemplary layouts beneath the insulating film of the circuit of FIG. 2.

FIG. 4 shows an exemplary layout of back-control/isolation-gates and lines that provides two different voltage levels to the back gate control/isolation regions. In FIG. 4:
p-doped back-control/isolation-gate regions are associated with: the isolation regions $I_{P1}$-$I_{P6}$; the two p-FET and n-FET transistors of the inverter $INV_2$; and with the two n-FET transistors of the logic gate NAND2; and
n-doped back-control/isolation-gate regions are associated with the isolation regions $I_{N1}$-$I_{N6}$ and with f the two p-FET and n-FET transistors of the inverter $INV_3$.

A back gate line $BG_P$ and a back gate line $BG_N$ serve for collectively connecting the p-doped back gate regions and the n-doped back gate regions, respectively, to the same potential. (Both lines therefore being at once both back-control-gate lines and back-isolation lines.) The back gate line $BG_P$ associated with the p-doped back gate regions may thus be in a high state (being typically connected to the potential $V_{DD}$), whereas the back gate line $BG_N$ associated with the n-doped back gate regions may be in a low state (being typically connected to ground GND).

As regards the isolation regions, their back-isolation-gate regions are biased by the back gate lines in such a manner that these isolation regions experience higher threshold voltages and consequently lower leakage currents $I_{OFF}$. This maintains better isolation between adjacent patterns along any one row.

As regards the inverter $INV_2$, the back control gate of the p-FET transistor and that of the n-FET transistor are in the high state $V_{DD}$. The conduction current $I_{ON}$ of the n-FET transistor is increased, while the conduction current of the p-FET transistor is reduced. This inverter thus has a low p-FET and a high n-FET. As regards the inverter $INV_3$, this inverter has a high p-FET and a low n-FET, because the back control gate of the p-FET transistor and that of the n-FET transistor are in the low state GND. And as regards the logic gate NAND2, the p-FET transistors do not have a back control gate and therefore operate in the nominal manner. The n-FET transistors do have back control gates in the high state, and therefore have a higher conduction current.

Figure 5:
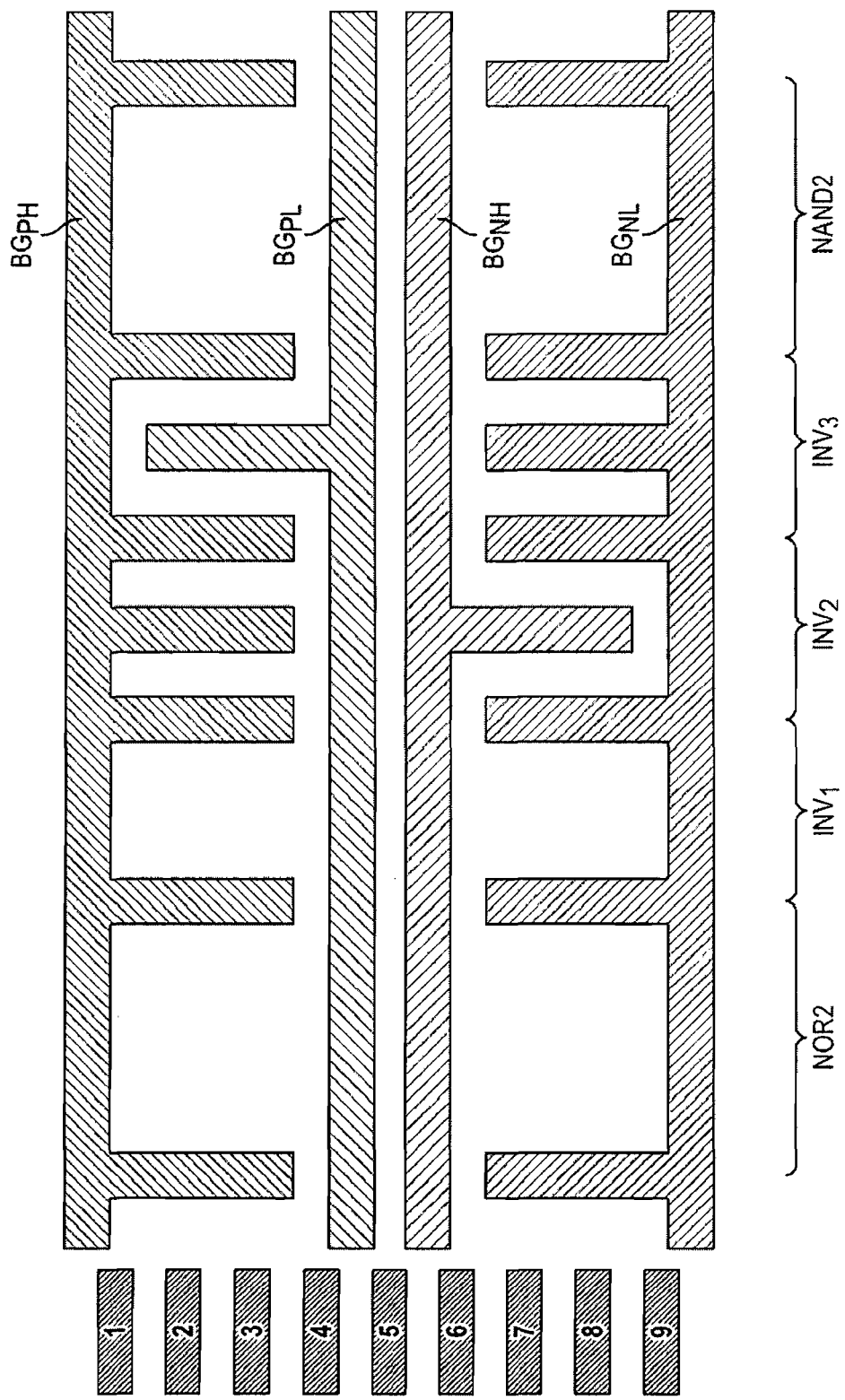

FIG. 5 shows another exemplary layout which provides four different voltage levels and thereby offers more flexibility. In FIG. 5:
p-doped back-isolation-gate regions associated with isolation regions $I_{P1}$-$I_{P6}$ and the back-control-gate region of the p-FET transistor of the inverter $INV_2$ are collectively connected to a back gate line $BG_{PH}$ in the high state;
a p-doped back-control-gate region associated with the p-FET transistor of the inverter $INV_3$ is connected to a back-control-gate line $BG_{PL}$ in a low state is;
n-doped back-isolation-gate regions associated with isolation regions $I_{N1}$-$I_{N6}$ and n-doped back-control-gate region associated with n-FET transistor of the inverter $INV_3$ are collectively connected to a back gate line $BG_{NL}$; and
an n-doped back control gate region connected to a back gate line $BG_{NH}$ in a high state is associated with the n-FET transistor of the inverter $INV_2$.

As in the example in FIG. 4, the leakage current of the isolation regions is thus reduced.

The inverter $INV_2$ has a low p-FET transistor (p-doped back control gate in a high state) and a high n-FET transistor (n-doped back control gate in a high state). In contrast, the inverter $INV_3$ has a high p-FET transistor (p-doped back control gate in a low state) and a low n-FET transistor (n-doped back control gate in a low state).

Figure 6:
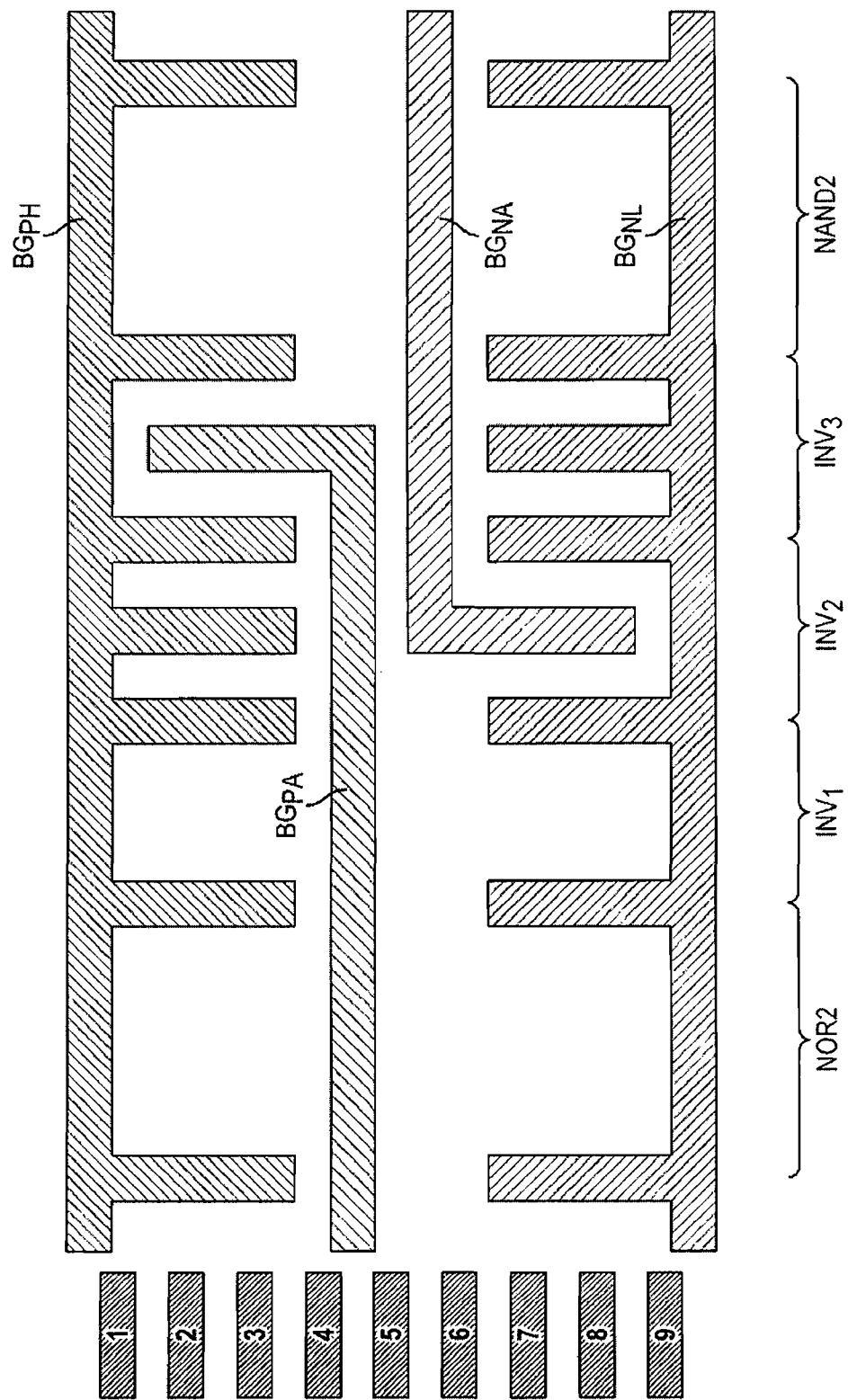

FIG. 6 shows another exemplary layout in which a back control gate associated with a transistor is connected to a back gate line which is associated only with that transistor. It will be understood that such an embodiment enables the potential applied to the back gate line dedicated to a single transistor to be individually modulated. In FIG. 6:
p-doped back-isolation-gate regions associated with isolation regions $I_{P1}$-$I_{P6}$ and p-doped back-control-gate region associated with the p-FET transistor of the inverter $INV_2$ are collectively connected to a back gate line $BG_{PH}$ in a high state;
a p-doped back control gate region connected to an individual back gate line $BG_{PA}$, the voltage of which can be adjusted, is associated with the p-FET transistor of the inverter $INV_3$;
n-doped back-isolation-gate regions associated with isolation regions $I_{N1}$-$I_{N6}$ and n-doped back-control-gate regions associated with the n-FET transistor of the inverter $INV_2$ are collectively connected to a back gate line $BG_{NL}$ in a low state; and
an n-doped back control gate region connected to an individual back gate line $BG_{NA}$, the voltage of which can be adjusted, is associated with the n-FET transistor of the inverter $INV_2$.

Thus, the inverter $INV_2$ has a low p-FET transistor (p-doped back control gate in a high state) and an adjustable n-FET transistor (individual n-doped back control gate addressed via the line $BG_{NA}$, the potential of which can be adjusted). The inverter $INV_3$, this has a low n-FET transistor (n-doped back control gate in a low state) and an adjustable p-FET transistor (individual p-doped back control gate addressed via the line $BG_{PA}$, the potential of which can be adjusted).

Figure 7:
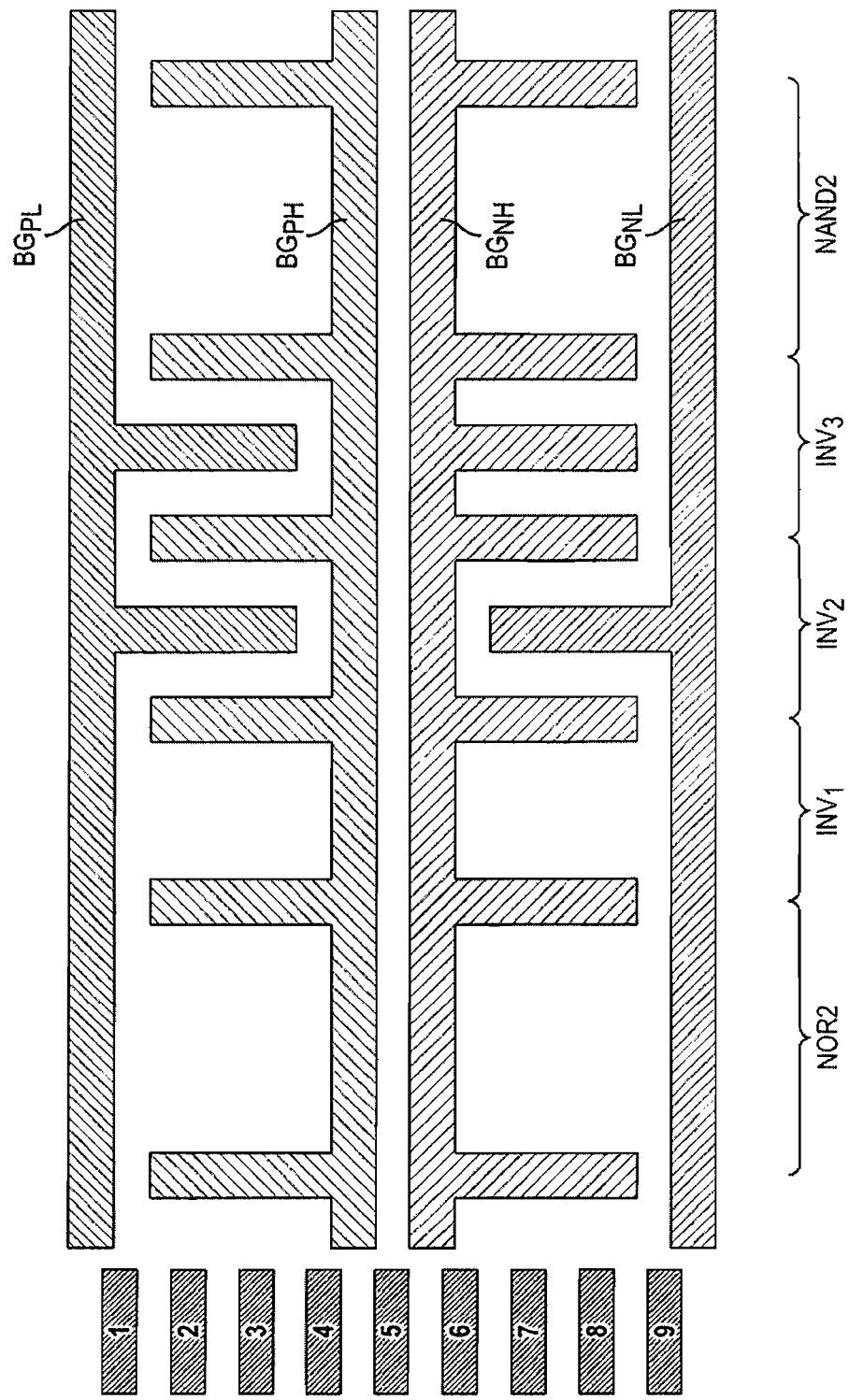
Figure 8:
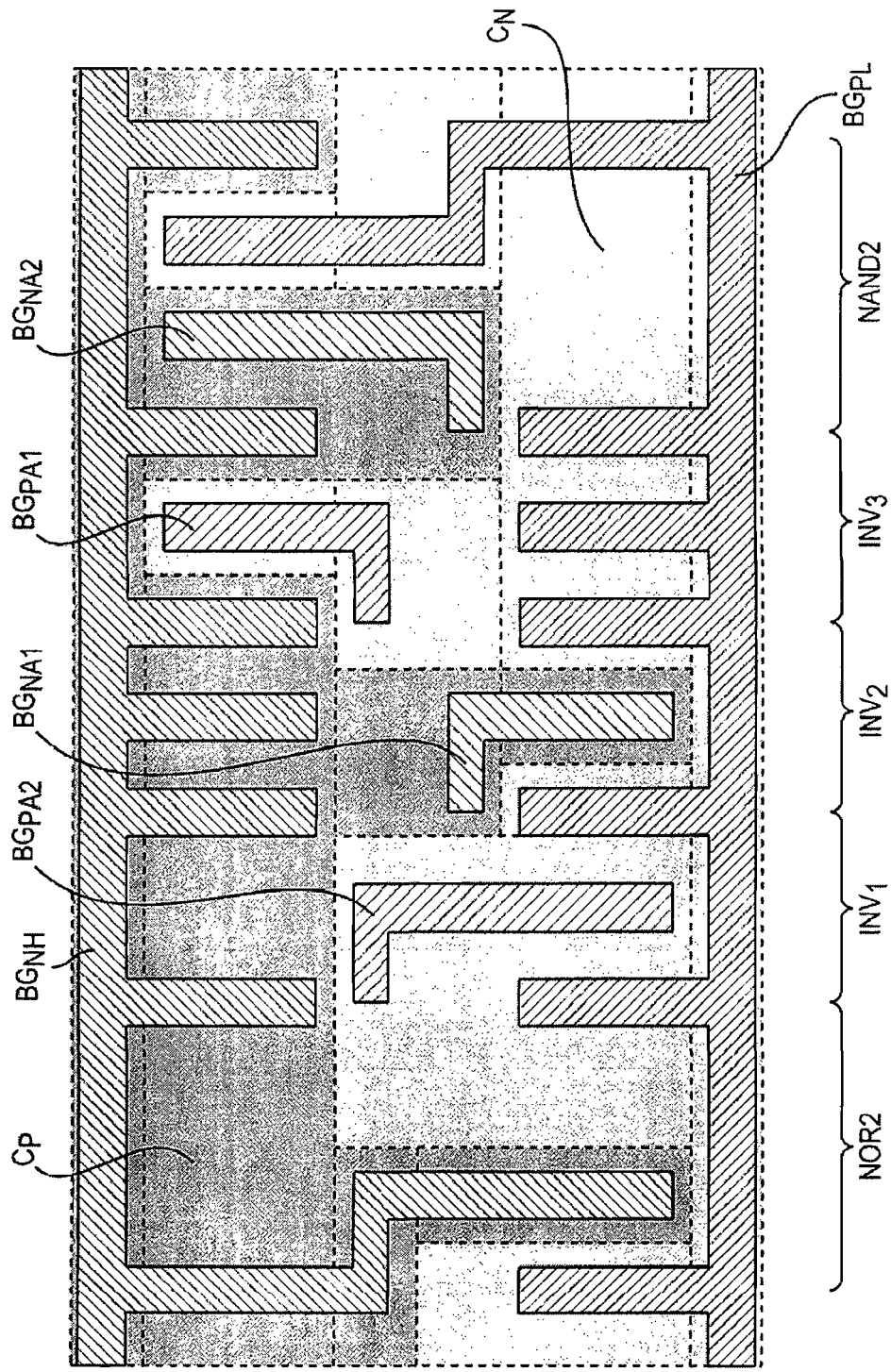

FIG. 7 shows an exemplary layout that is an alternative to the layout of the example of FIG. 5. In FIG. 7:
- p-doped back-isolation-gate regions are collectively connected to a back gate line $BG_{PH}$ in a high state, and are associated with the isolation regions $I_{P1}$-$I_{P6}$;
- p-doped back-control-gate regions are collectively connected to a back gate line $BG_{PL}$ in a low state, and are associated with the p-FET transistor of the inverter $INV_2$ and with the p-FET transistor of the inverter $INV_3$;
- n-doped back-isolation-gate regions associated with $I_{N1}$-$I_{N6}$ and n-doped back-control-gate regions associated with the isolation regions and with the n-FET transistor of the inverter $INV_3$ are collectively connected to a back gate line $BG_{NH}$; and
- an n-doped back-control-gate region is connected to a back gate line $BG_{NL}$ in a low state, and is associated with the n-FET transistor of the inverter $INV_2$.

Thus, the inverter $INV_2$ has a high p-FET transistor (p-doped back control gate in a low state) and a low n-FET transistor (n-doped back control gate in a low state). The inverter $INV_3$ has a high p-FET transistor (p-doped back control gate in a low state) and a high n-FET transistor (n-doped back control gate in a high state).

FIG. 8 shows a preferred layout in which the isolation regions are associated with back isolation gate regions having a conductivity of opposite type. The leakage currents in these isolation regions are thus further reduced. More precisely, in FIG. 8:
- n-doped back-isolation-gate regions associated with the p-doped isolation regions $I_{P1}$-$I_{P6}$ and n-doped back-control gate regions associated with one of the n-FET transistors of the logic gate $NOR_2$ and the p-FET transistor of the inverter $INV_2$ are collectively connected to a back gate line $BG_{NH}$ biased in a high state;
- a p-doped back control gate region is connected to an individual back gate line $BG_{P41}$, the voltage of which can be adjusted (to any intermediate value chosen by the skilled person), and is associated with the p-FET transistor of the inverter $INV_3$;
- p-doped back-isolation-gate regions associated with the n-doped isolation regions $I_{N1}$-$I_{N6}$ and p-doped back-control gate regions associated with one of the p-FET transistors of the logic gate NAND2 and with the n-FET transistor of the inverter $INV_3$ collectively are connected to a back gate line $BG_{PL}$ in a low state;
- a p-doped back-control-gate region is connected to an individual back gate line $BG_{P42}$, the voltage of which can be adjusted (to any intermediate value chosen by the skilled person), and is associated with the n-FET transistor of the inverter $INV_1$;
- an n-doped back-control-gate region is connected to an individual back gate line $BG_{N41}$, the voltage of which can be adjusted (to any intermediate value chosen by the skilled person), and is associated with the n-FET transistor of the inverter $INV_2$; and
- an n-doped back-control-gate region is connected to an individual back gate line $BG_{N42}$, the voltage of which can be adjusted (to any intermediate value chosen by the skilled person), and is associated with the p-FET transistor of the logic gate NAND2 which is not connected to $BG_{PL}$.

$C_P$ and $C_N$ represent the wells that isolate the n-type and p-type back control/isolation gates respectively. The wells CP are typically in the low state GND, whereas the wells $C_N$ are typically in the high state $V_{DD}$.

Thus, the isolation regions $I_{P1}$-$I_{P6}$ have a p-channel with a p-type back control gate in the high state (typically at $V_{DD}$). These regions have a maximum threshold voltage and consequently a minimum leakage current. The isolation regions $I_{N1}$-$I_{N6}$ themselves have an n-channel with an n-type back control gate in the low state (typically at GND). These regions have a maximum threshold voltage and consequently a minimum leakage current.

One of the n-FET transistors of the logic gate $NOR_2$ also has an n-channel, but with an n-type back control gate in the high state. It thus has a minimum threshold voltage and consequently maximum performance characteristics (in terms of conduction current $I_{ON}$). The n-FET transistor of the inverter $INV_1$ has an n-channel with a p-type back control gate, the voltage of which can be adjusted. Thus, this transistor has performance characteristics lying between the minimum performance characteristics and the mean performance characteristics depending on the voltage applied to the individual line $BGP_{42}$.

The p-FET transistor of the inverter $INV_1$ does not have a back control gate, and therefore it operates in a nominal manner.

The n-FET transistor of the inverter $INV_2$ has an n-channel with an n-type back control gate, the voltage of which can be adjusted. Thus, this transistor has performance characteristics lying between the mean performance characteristics and the maximum performance characteristics depending on the voltage applied to the individual line $BGP_{N41}$.

The p-FET transistor of the inverter $INV_3$ has a p-channel with a p-type back control gate, the voltage of which can be adjusted. Thus, this transistor has performance characteristics lying between the minimum performance characteristics and the mean performance characteristics depending on the voltage applied to the individual line $BGP_{P41}$.

The p-FET transistor of the logic gate NAND2, which does have an n-type back control gate, the voltage of which can be adjusted via the individual line $BG_{N42}$, has performance characteristics lying between the mean performance characteristics and the maximum performance characteristics. The p-FET transistor of the logic gate NAND2, which has a p-type back control gate, the voltage of which is in the low state via the line $BG_{PL}$, has itself a minimum threshold voltage and maximum performance characteristics.

Figure 9:
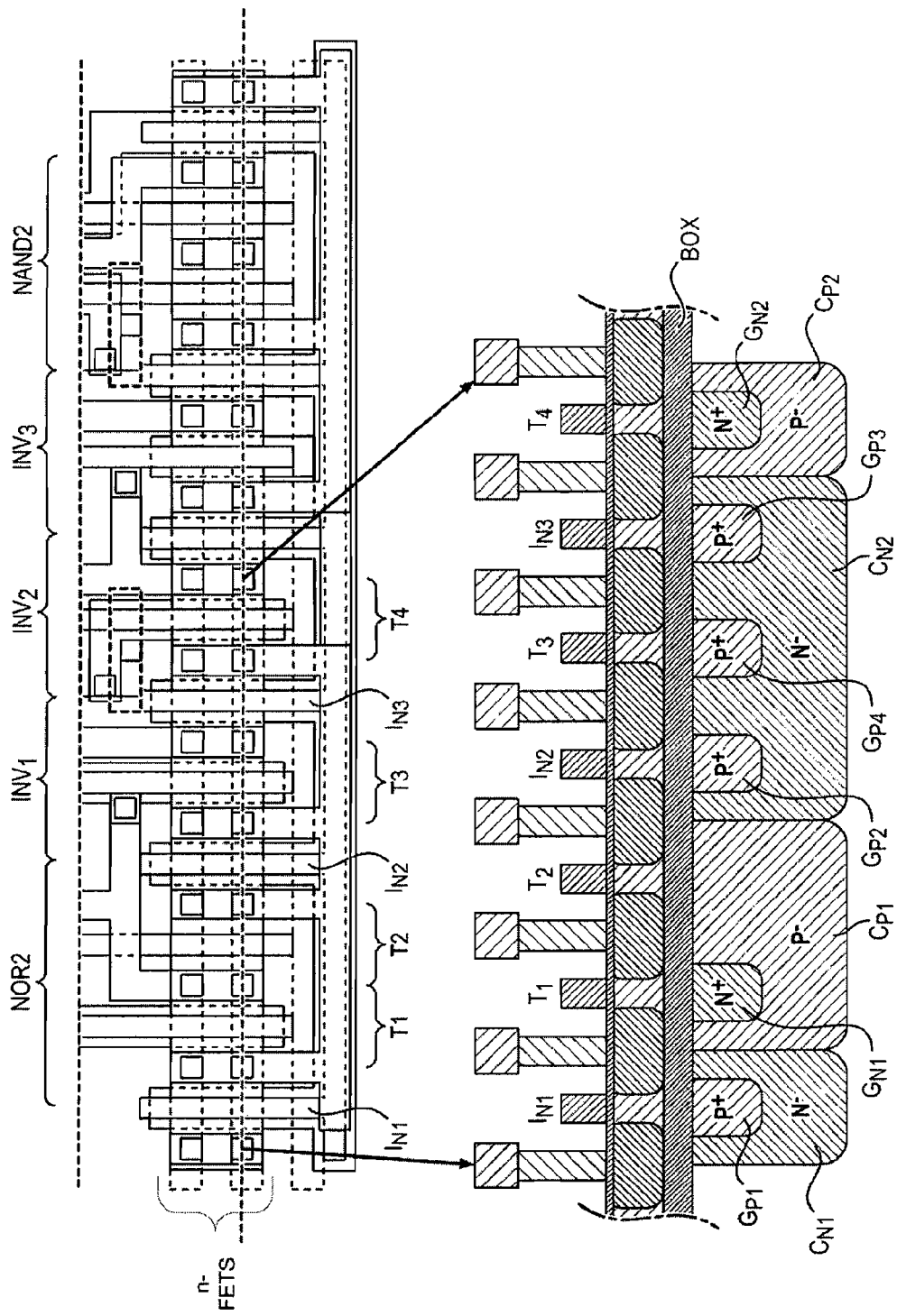
FIG. 9 illustrate a sectional view of a row of FET transistors of the circuit of FIG. 7.

The upper part of FIG. 9 shows two metal (preferably at level 2) lines, 7 and 8, along which the FET transistors of the circuit shown in FIG. 8 are placed. The lower part of FIG. 9 shows a sectional view of a portion of metal (preferably at level 2) line 8 comprising the isolation regions $I_{N1}$-$I_{N3}$ and the n-FET transistors $T_1$-$T_4$ of the NOR2 ($T_1$ and $T_2$), $INV_1$ ($T_3$) and $INV_2$ ($T_4$) patterns. In this sectional view, the insulating film bears the reference BOX.

In FIG. 9, the transistor channels are fully depleted, the source and drain regions being in contact with the insulating film. However, the invention also applies to the partially depleted technology in which the source and drain regions do not extend into the entire thin film. It should be noted in this case that the back control gate is overall less effective as it is further away from the channel region between the source and drain regions.

In FIG. 9, and as discussed above,
- the isolation regions $I_{N1}$-$I_{N3}$ have an n-channel and each region has a p$^+$-type back control gate $G_{P1}$-$G_{P3}$ (in the low state via the line $BG_{PL}$);
- one of the nFET transistors, $T_1$, of the logic gate NOR2 has an n$^+$-type back control gate $G_{N1}$ (in the high state via the line $BG_{NH}$), whereas the other nFET transistor, $T_2$, of the logic gate NOR2 does not have a back control gate;
- the nFET transistor $T_3$ of the inverter INV1 has a p$^+$-type back control gate $G_{P4}$ (which can be adjusted via the individual line $BG_{P42}$). The nFET transistor $T_4$ of the inverter $INV_2$ has an $n^+$-type back control gate $G_{N2}$ (which can be adjusted via the individual line $BG_{N41}$).

Also in FIG. 9, the associated back control gate is localized so as to extend only opposite the channel of the associated transistor. For example, the back control gate is formed by implanting dopants beneath the insulating film BOX. The back control gate is isolated from the base substrate by a well $C_{N1}$, $C_{P1}$, $C_{N2}$, $C_{P2}$ of opposite conductivity to that of the control gate ($n^-$-type well $C_{N1}$, $C_{N2}$ for a $p^+$-type back control gate $G_{P1}$, $G_{P2}$, $G_{P3}$, $G_{P4}$; $p^-$-type well $C_{P1}$, $P_{P2}$ for an $n^+$-type back control gate $G_{N1}$, $G_{N2}$).

The well voltage is chosen so that the diode created by the electrical node between the back control gate and the well is always reverse-biased, the diode isolating the back control gate from the well and from anything that it may contain (especially other back control gates). In fact, it is of course possible to provide a well common to several back control gates of the same type, as is the case for the well $C_{N2}$ which collectively isolates the back control gates $G_{P2}$, $G_{P3}$ and $G_{P4}$.

Application to an Data-Path-Cells-Like Circuit Structures

The invention is applicable to data-path cells and to integrated circuits comprising one or more data-path cells. Each data-path cell is specifically developed for a particular circuit or circuit environment (e.g., for microprocessors) and is consequently highly adapted to its operating environment. Typically, a data-path cell comprises an input stage and an output stage. It may also include one or more intermediate stages connecting the input stage to the output stage. In a particular integrated circuit comprising data-path cells, the cells are often arranged in a regular spatial manner so that the cells and the associated FETs can be considered as an array of cells or of FETs In this invention, each of the stages of a data-path cell will typically include FET transistors that are produced on an SeOI substrate, especially on an SOI (silicon on insulator) substrate. As is conventional, each FET transistor typically has a source region, a drain region, a channel region which separates the source region from the drain region, and a front control gate separated from the channel by a gate dielectric layer.

To maximize the speed of such a data-path cell, or indeed of virtually any CMOS circuit, various design maneuvers are possible. According to a first design maneuver, the length of the electrical connections connecting the data-path cells together or the length of the electrical connections connecting the stages of a data-path cell together can be shortened. The connections then have reduced capacitance resistance.

According to another design maneuver, output stages may be provided that have low output impedances. Such output stages then have a high level of conduction for rapidly charging the output electrical connection or connections and the input stage or stages of the following data-path cell. This latter maneuver typically requires the use of large transistors, particularly transistors having a large width because conduction is often proportional to transistor width. However, it should be noted that the capacitance of an output stage constitutes a load (for the input stage or the intermediate stage(s) of the data-path cell) which is higher the larger the dimensions of the transistors that make up the output stage, because capacity is often proportional to transistor size. Furthermore, the power consumptions of larger transistors, under both static and dynamic conditions, is larger, because power consumption is proportional to dimensions.

According to another design maneuver, input stages may be provided that have low-capacity. This may be achieved by reducing the dimensions of the FETs of the input stage of a cell. The load of the preceding cell is thus reduced. But by reducing the dimensions, there is a risk of this input stage not having a sufficient level of conduction for effectively charging the intermediate stage (if present) or the output stage. Moreover, performance variability may result from excessive miniaturization. In particular, then there is then a risk of parallel data-path cells having substantially different speeds.

Generally, any stage constitutes both an output to the following stage or following cell and an stage from the preceding stage or preceding cell. Therefore, for each stage, a compromise must be sought between transistors of small dimensions, in order to reduce the capacitance thereof (and therefore reduce the load of the preceding stage or stages) and transistors of large dimensions in order to reduce the resistance thereof (and therefore to charge the following stage or stages effectively).

More generally, data-path cells are often optimized relative to their circuit context or intended environment. Accordingly, instead of exclusively optimizing the capacitance or the resistance (the inverse of the conductance), it can be desirable to optimize both together. In such situations, the footprint of the data-path cell may be reduced by up to about 25% (and preferably between 15% and 25% because of reduced sizes) while the conductivity can even be increased (by properly-biases back control gates).

The following equation, drawn from article "Closed-form Expressions for Interconnection Delay, Coupling, and Crosstalk in VLSI's" by T. Sakurai, in IEEE Transactions On Electron Devices, Vol. 40, No. 1, January 1993, illustrates the propagation delay $T_v$ between an output stage and an input stage and possible performance improvement achievable by this invention:

$$T_v = 0.1 R_{int} C_{int} + ln\left(\frac{1}{1-v}\right)(R_{buf} C_{int} + R_{int} C_{buf} + R_{buf} C_{buf} + 0.4 R_{int} C_{int}).$$

In this equation:
$R_{int}$ and $C_{int}$ represent the resistance and the capacitance, respectively, of the electrical connection between stages, these values varying depending on the lithography (32 nm in the example considered below) and on the length of the connection (between 10 nm and 10 μm in the example);

$R_{buf}$ represents the resistance (inverse of conductance) of the output stage at the entry of the electrical connection; and $C_{buf}$ represents the impedance (inverse of capacitance) of the input stage at the other end of the electrical connection.

Figure 10:
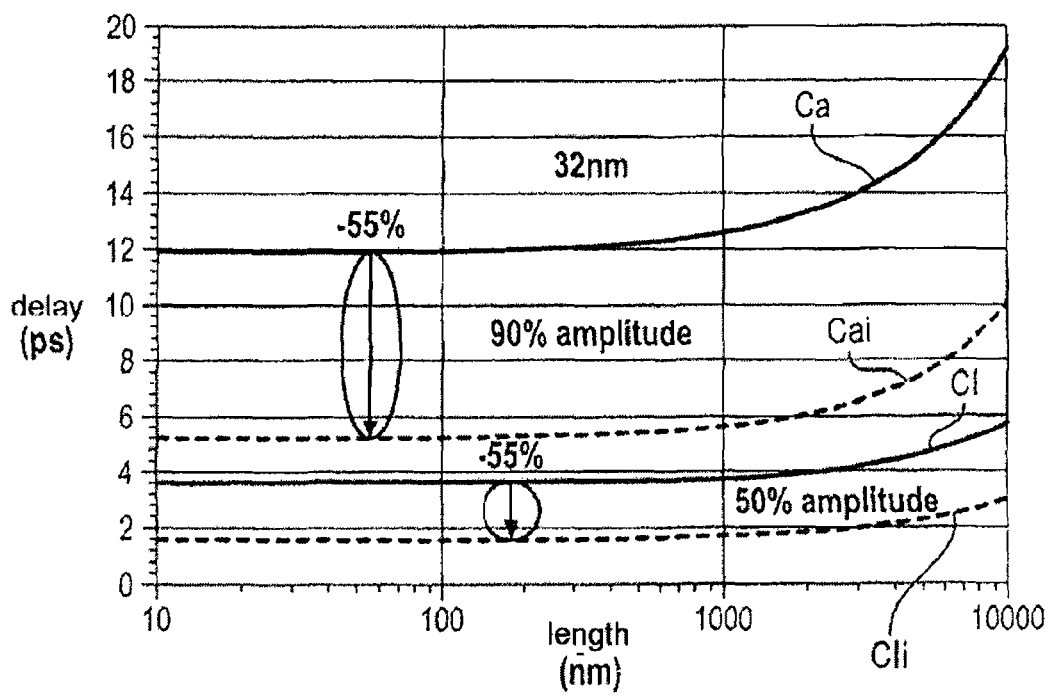
FIG. 10 illustrates propagation delay (in picoseconds (ps)) as a function of the connection length (in nm)

The curves Ca and Cl in FIG. 10 show the propagation delay (in picoseconds (ps)) as a function of the connection length (in nm), for propagation of 90% of the amplitude of an analogue signal and for 50% propagation of the amplitude of a digital signal, respectively.

As already described, it is possible to vary one or both of $C_{buf}$ and $R_{buf}$; $C_{buf}$ can be varied by a reduction in the dimensions of the transistor; and $R_{buf}$ can be varied by providing and properly biasing the back control gate. In one exemplary embodiment, $C_{buf}$ and $R_{buf}$ are reduced by 33%. Curves Cai and Cli in FIG. 10 illustrate the substantial reduction (by about 55%) in the propagation delay for the analogue and digital situations respectively in this embodiment.

Accordingly, at a given technology node (e.g., the 45 nm technology node), the invention makes possible CMOS data-path cells formed on SeOI substrates having transistors with more advantageous characteristics, such as capacitance and conductance (considered individually or in combination), when compared with similar CMOS data-path cells formed on bulk substrates.

For example, this invention makes possible transistors (e.g., in given stage of a data-path cell) with smaller capacitances (e.g., because of their smaller sizes), which may therefore be charged more rapidly by preceding output transistors (e.g., by preceding stages of a data-path cell). Because transistor conductance can be increased by use of back control gates, such smaller transistors need not have the proportionately smaller conductance that might be expected because of their decreased sizes. This invention also makes possible transistors (e.g., in given stage of a data-path cell) with larger conductance, which may therefore charge more rapidly succeeding input transistors (e.g., in succeeding stages of a data-path cell). Also, because transistor conductance can be increased by use of back control gates as well as by increased sizes, such larger-conductance transistors need not have the proportionately larger capacitance that might be expected if the larger conductance were due to larger size.

These advantages provided by the invention are already apparent at the 45-nm-lithography technology node. But they become even more apparent at finer technology nodes, e.g., the 32 nm node, because thickness ratios and voltages become more and more favorable to the invention at finer and finer technology nodes. Preferably, the invention is applied at least as the 45 nm technology node, and more preferably at finer technology nodes.

In more detail, concerning capacitance, the invention makes possible design and use of transistors (e.g., transistors in CMOS data-path cells formed on SeOI substrates with back control gates) having smaller physical widths smaller, and thus smaller capacitance, than the physical widths of transistors with similar conductance would have in the absence of the invention (e.g., transistors in CMOS data-path cells formed on bulk substrates and without back control gates), even though it is known that reducing transistor widths also reduces the conductance of the data-path-cell stage to which such a transistor belongs. For example, if the width of a transistor is reduced by a factor of up to about two, then the transistor's input capacitance is also reduced by an approximately similar factor. In such a way, the load of the preceding stage or stages of the data-path cell is reduced.

In more detail, concerning conductance, the invention makes possible design and use of transistors (e.g., transistors in CMOS data-path cells formed on SeOI substrates with back control gates) having conductance (conduction currents) larger than the conductance of similar transistors with similar widths would have in the absence of the invention (e.g., transistors in CMOS data-path cells formed on bulk substrates and without back control gates), even though it is known that increasing transistor conductance generally requires increasing transistor width and, therefore, capacitance. In other words, it is possible to reduce the resistance (increase the conductance) of the stage to which this transistor belongs so that the following stage or stages may be more effectively charged. Otherwise stated, back control gates generally make possible reductions of the widths of transistors without reducing the conductance of the transistor (starting from the 45 nm lithography).

In both cases, such increased conductance depends on properly biasing the back control gates of the associated transistors (the effective width of the channel is thus increased without the physical width being modified).

Reduced capacitances (due to reduced physical widths) and increased conductance (due to increased effective widths arising from properly biased back control gates) can be combined to achieve various effects. For example, this invention makes possible a reduction of the load (because of a reduced capacitance consequent to smaller widths) of a particular stage of a data-path cell as seen by a preceding stage of that cell by up to about 33% (and preferably at least 20%) with a constant level of conduction (because the conductance that would be reduced because of a smaller width can be increased by a properly-biases back control gate). In the absence of a back control gate, it is intuitively estimated and believed that only a quadratic factor ($\sqrt{2}$) of width reduction is usually preferable.

Alternately stated, this invention makes possible an impedance reduction (due to a capacitance reduction) of around 33% (and preferably at least 20%) at the 32 nm technology node in comparison to the 45 nm technology node without having to increase the relative size of the transistors (in order to preserve conductance). This reduction can be even greater for the next-generation technologies. Such an impedance reduction results from the smaller lithographic features; and relative transistor sizes need not be increased results because properly-biases back control gates can restore conductivity decreases that would be expected because of reduced sizes At the 32 nm technology node, such reductions in propagation delay permit operating speeds to be up to about approximately doubled (more conservatively, to be increased by up to about 33% (and preferably between 25% to 33%)). At the same time, the footprint of the data-path cell may be reduced by up to about 25% (and preferably between 15% to 25%).

Also transistors of this invention can have reduced leakage currents and, therefore, also reduced power consumption (in comparison to similar transistors conventionally designed without back control gates and/or on bulk substrates). This reduction in leakage is due both to the use of smaller transistors and also to appropriately biasing the back control gate when the transistor is in the off-state (thereby, reducing the leakage current $I_{OFF}$). For example, the power consumption may thus be reduced by up to about 33% (and preferably between 25% to 33%) in the on-state, and can be reduced up to about one to two decades in the off-state in comparison to a similar data-path cell in conventional CMOS technology. Such reductions in power consumption generally occur at a constant operating frequency insofar as power consumption varies directly with switching speed (frequency).

Also transistors of this invention can operate at higher frequencies. It is well known that transistors with reduced size, or with higher conductance, or with both reduced size and higher conductance, such as the transistors of this invention, are capable of markedly faster operation. Thus, the transistors of this invention can operate at higher frequencies, and can do so without necessarily consuming more power (in comparison to similar transistors conventionally designed without back control gates and/or on bulk substrates). In this invention, higher frequency operation simply means a commensurately higher usage factor without necessarily higher power consumption. A conservative estimate of operating frequency increase is up to about 50% (and preferably between 30% to 50%).

Summarizing, this invention provides back control gates for one or more of these FET transistors. The back control gates are positioned in the bulk of the SeOI substrate (i.e., below the buried oxide layer) facing the channels of the associated transistors. Further, this invention provides back gate lines connecting one or more back control gates. The back gate lines are preferably structured with respect to the data-path cells so that the associated cells if the invention can be appropriately controlled, e.g., the input stage FETs begin controlled to optimize the properties of the input stages, while the output stage FETs begin separately controlled to optimize the different properties of the output stages (and, optionally, the intermediate state FETs being separately controlled).

Figure 11A:
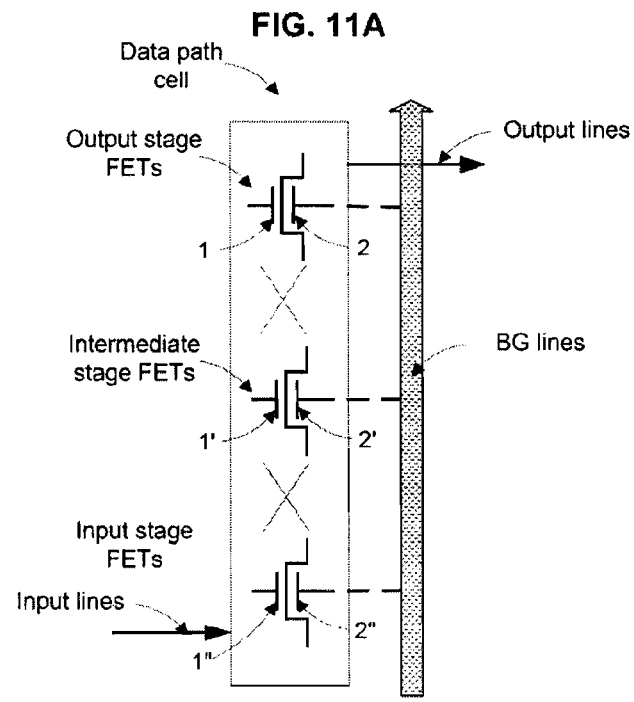
FIGS. 11A and 11B illustrate in a schematic fashion data-path cells and circuits including data-path cells.

Turning specifically to now data-path-cell and data-path circuit structures including back control dates, FIG. 11A illustrates an exemplary CMOS data-path cell of the invention. The illustrated cell includes input stage FETs (field effect transistor) which receive input lines from, e.g., preceding data-path cells in a data-path. The FETs are illustrated with conventional symbols, where 1, 1' and 1" are front control gates (also referred to as gates). The illustrated cell also includes output stage FETs which provide output lines to, e.g., following data-path cells in a data-path. Finally, the illustrated data-path cell also includes intermediate stage FETs which are interconnected with the input and output stages and perform the prescribed processing functions of the data-path cell. In other embodiments, intermediate stage FETs are not present, and the input and output stage FETs are directly interconnected.

The FETs of the data-path cell illustrated in FIG. 11A also have back control gates 2, 2' and 2". All though all illustrated FETs here have back control gates, alternatively not all FETs have back control gates, e.g., only one or a few of the FETs of the data-path cell can have back gates. These back control gates are also illustrated as individually connected to back control gate lines (BG lines) which lead externally from the data-path cell. The back gate lines can also interconnect the back gates of FETs within the cell in various manners. For example, some or all of the back gates of the input stage can be connected together, as can the back gates of the intermediate and output stages.

The stippled arrow external to the cell represents that the back control gates can be externally connected in numerous manners. For example, all the back control gates of one data-path cell can be connected together to one or more external lines; or the back gates of the input, intermediate, and output stages can be separately connected to individual external lines, or the back gates of individual FETs can be connected to individual external lines. These external lines can then interconnect the back control gates of two or more data-path cells in various manners. For example, the back control gates of the input stages of a group of cells can be connected together, as can the back gates of the intermediate and output stages of this group of data-path cells.

In short, it will be apparent that the back control gate of an array of FETs, whether the FETs are arranged as part of one or more data-path cells or whether the FETs are individually arranged, can be connected together so that the FETs array can be specifically adapted to a particular circuit environment for use in a particular integrated circuit.

Accordingly, the data-path cells in a particular integrated circuit of this invention, which as described can often be considered as a spatial array of FETs, can be specifically adapted both to a particular environment within the integrated circuit and also, to the particular integrated circuit environment in general.

Figure 12:
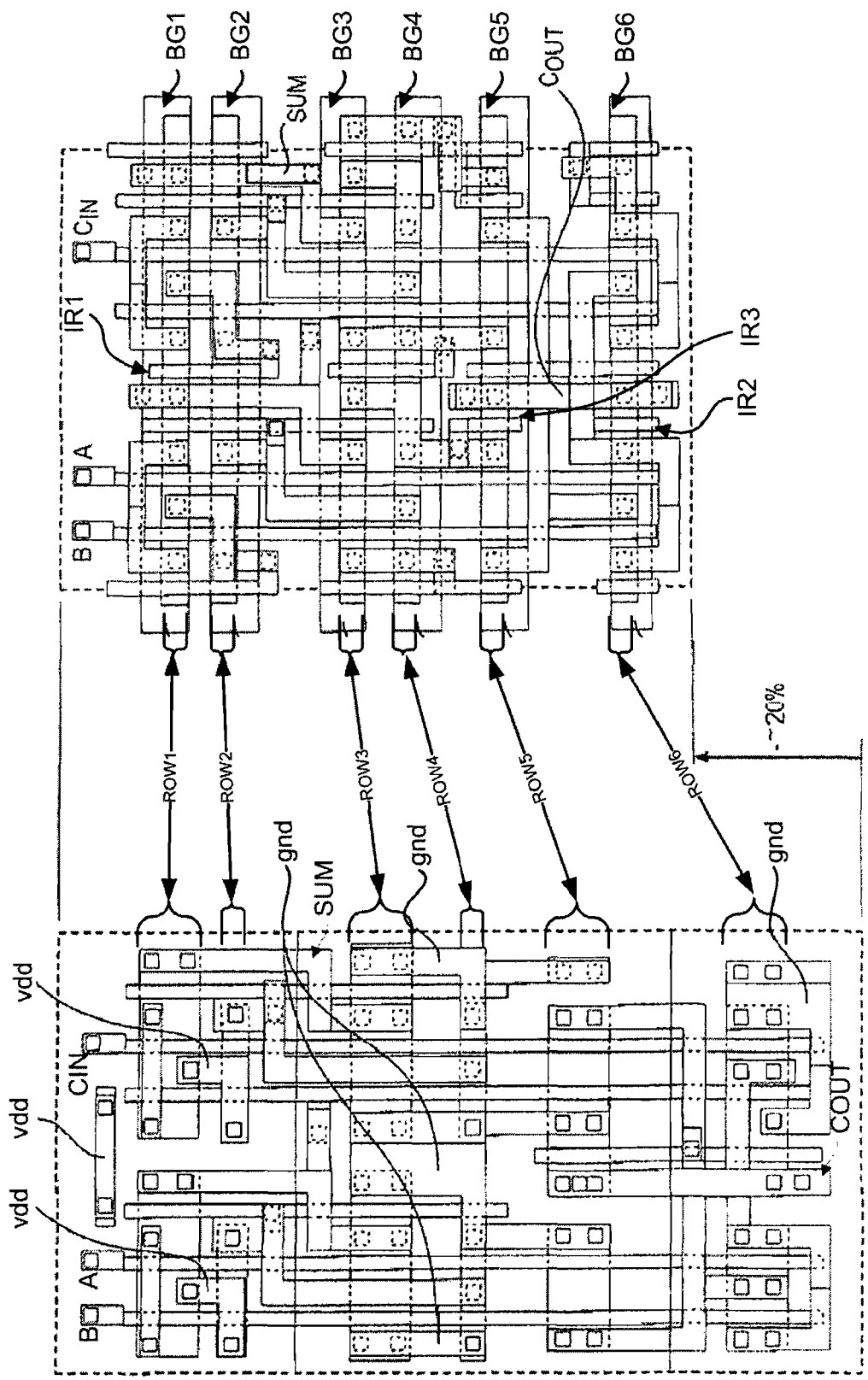
FIG. 12 compares a CMOS data-path cell on a bulk substrate with a CMOS data-path of the invention formed on a SeOI substrate.

FIG. 12 shows a comparison between an exemplary one bit full-adder data-path cell designed for fabrication in bulk CMOS technology in the absence of the invention (on the left in FIG. 12) and the same data-path cell designed for fabrication on an SeOI substrate taking advantage of the invention (on the right in this figure).

The transistors of this exemplary data-path cell according to the invention are arranged in parallel rows. The one bit input lines are labeled "A" and "B." CIN and COUT are the input and output, respectively, carry bit. Connections to ground and Vdd potentials are illustrated in the left-hand version only.

Back-control-gate lines BG1-BG6 extend in the bulk substrate beneath the insulating layer along each row linking the back-control-gate regions arranged under the FETs of each row. In this embodiment, the back-control-gate lines are simply extensions of the linked back-control-gate regions so that both can be readily defined by a single (or a minimum number of) additional photolithographic steps.

This figure illustrates the reduction in footprint that can be achieved by the back gates of the invention. Here, the reduction is about 20%. First, even though the transistors in the right-hand version according to the invention all have the same dimensions, each transistor (or each group of transistors, here especially, each row of transistors) can have an individually selected "scale factor," or individually selected effective width, simply by applying a different potential to each back control gate.

For example, the left-hand version has rows of FETs at least two different sizes: row2 and row4 of a first width; and row1, row3, row5 and row6 of a second width that is approximately double the first width. However, all rows in the right-hand version according to the invention all rows of FETs can have approximately the same first width because the effective width of the FETs of row1, row3, row5 and row6 can be doubled (e.g., have a "scale factor" of approximately 2.0) by applying an appropriate bias potential to their corresponding back-control-gate regions through back-control-gate lines BG1, BG3, BG5 and BG6. On the other hand, the FETs of row2 and row4 can be minimally biased so as to have a "scale factor" near 1.0.

Footprint reduction is additionally facilitated by the presence of isolation regions. For example, the left-hand version separates the FETs of (at least) row1, row5 and row6 into separate active zones by the gaps between these zones that are readily apparent. However, in the right-hand version according to the invention, isolation regions IR1, IR2 and IR3 are provided to replace these gaps. As the isolation regions can be narrower that the active-zone gaps, footprint can be further reduced.

Further, this figure illustrates how increases in performance can be achieved. First, because of the footprint reduction, lengths of connections on the right are less than on the left allowing faster signal propagation. Second, those rows of reduced widths, row1, row3, row5 and row6, have FETs of reduced capacitance compared to the version on the left. Because of the reduced capacitance, these FETs will charge more quickly and can operation at higher frequency. Both effects operating together can least to a greater than 20% performance improvement.

Further, this figure illustrates how this invention promote ease of fabrication. The exemplary cell on the right of FIG. 12 is particularly configured and structured so as to be advantageous for photolithography in that this data-path cell comprises continuous bands of active zones; and the transistors of any one row (e.g., active zone) have the same dimensions (especially the same width). Accordingly, it provides a regularized configuration for limiting the aberrations and deformations caused by reducing the dimensions under the wavelength of the light that exposes the photoresist masks. This regularized configuration is based especially on a single polysilicon orientation (giving only a single dimensional tolerance in relation to the fabrication tools) and on a single polysilicon pitch (giving better control of the optical phenomena).

The design illustrated in FIG. 12 is not limiting, because the invention also covers transistors having different physical dimensions (particularly different widths) along any one row.

Figure 11B:
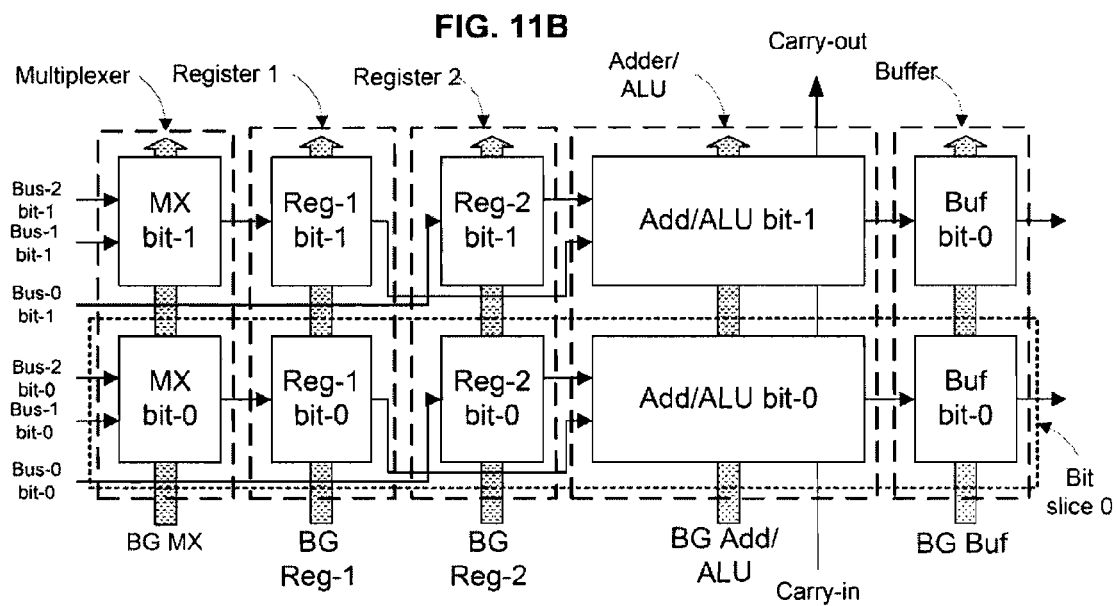

Concerning circuits including a plurality of data-path cells (and other circuits) including transistors of this invention, FIG. 11B illustrates an exemplary data-path, that is a circuit including a plurality of data-path cells. In the illustrated circuit, the data-path cells are arranged as a 2-bit wide data-path that might occur in a microprocessor. In this exemplary circuit, the multiplexer selects which of the input bus-1 or the input bus-2 is stored in register 1. Input of bus-0 is stored in register 2. The ALU processes the outputs of registers 1 and 2. The buffer stores and outputs the results of the processing by the ALU.

This circuit is arranged in an array-like fashion with two axes, conventionally taken as a horizontal axis and a vertical axis. Data-path cells performing similar processing of individual bits, e.g., multiplexing, storing (in registers), adding, and buffering, are arranged along one (the vertical) axis, and individual processing stages are arranged along the other (the horizontal) axis. Here, except for the ALU cells, data-path cells from the individual bits are substantially independent. Accordingly, data lines generally (in the manners expected in VLSI routing) run along the horizontal axis from the input, to a first data-path cell, to subsequent data-path cells, and to the output.

Some or all of the FETs of the individual data-path cells of FIG. 11B have back control gates connected to back gate control gate lines. It has already been described with reference to FIG. 11A that these back gate lines can interconnect the back gates within individual cells in various manners, and can also connect the back gates of individual cells to external lines in various manners. FIG. 11B now illustrates that external back gate lines can interconnect the back gates of separate data-path cells. In general, these external interconnections can be selected as necessary so that the plurality of data-path call can be specifically adapted to a particular circuit environment for use in a particular integrated circuit.

In a preferred embodiment, the back gates of data-path cells performing similar functions can be interconnected (e.g., along a column). Also, the back gates of the input (or of the intermediate or of the output) stages of multiple data-path cells (e.g., of data-path cells performing similar functions along a column) can be interconnected. In this embodiment, the result is the array-like arrangement then includes one or more back gate lines running along the vertical direction. The primarily vertical back gate lines and the primarily horizontal data lines mutually define a grid-like arrangement. The FETs then have an array-like arrangement disposed within this grid.

It will have been understood that the invention is not limited to a data-path cell according, but also extends to other embodiments providing integrated circuits comprising such cells, to methods of driving such cells, and to method of designing such cells in which the physical width of at least one transistor of the cell is reduced so as to decrease the capacitance thereof and a back control gate is added to the transistor in order to increase the conductance thereof Methods of the Invention Moreover, the invention is not limited to providing the devices having back gates (both for control and isolation), but rather the invention also provides methods of driving such devices in which the back control or isolation gate regions are biased positively or negatively in order to shift the threshold voltage of the transistors. Advantageously, a p-type back isolation gate can be connected to ground, and an n-type back isolation gate can be connected to a nominal supply voltage.

As mentioned above, the application of a back gate voltage on a FDSOI (fully-depleted SOI) transistor modifies the electrical characteristic of the device. Simply described, a higher voltage on the back gate reduces the threshold voltage of an N-channel device and vice-versa. The same applies on P channel devices.

It is possible to saturate this effect by applying very high voltages on the back gates. For instance a (very) high voltage applied on an N-channel transistor can reduce its threshold down to a negative value, making the transistor always ON, despite the voltage level applied on its front gate. On the contrary, a (very) high negative voltage on the back gate increases the threshold above the power supply, Vdd, at a level at which the transistor remains OFF for all operating voltages applied on its front gate (0–Vdd). By symmetry the same apply on the complementary P channel device.

In other words, transistors can be transformed into "open" and "shorts" through an appropriate back gate control voltage. This feature proves to be particularly efficient for creating reconfigurable logic. It is also useful for controlling isolation regions to become effectively "open" (or non-conducting) in order to isolate devices as required.

The methods provided by the invention are also for operating standard cells and data-path cells having transistors with back control gates and methods of operating circuits containing data-path cells of this invention (and methods of operating other circuits having transistors of this invention with back gates). In general, these methods select the conductance of a transistor by varying the size of the potential or bias applied to its back control gate. This is equivalent to changing the effective width of the transistor so that the transistor can have an individually selected "scale factor."

In some embodiments, such methods include biasing one or more back control gates according to the functional role of the transistors in a circuit or data-path cell. In such methods, the applied bias typically remains substantially constant over a large number of cycles of circuit operation, or even substantially constant over longer periods of time. For example, for transistors in data-path cells, they include applying a first potential to certain output stage transistors so that they have increased conductance (decreased resistance) so that they can drive subsequent stages more rapidly. A second potential can be applied to certain other data-path cell transistors to reduce their leakage current in the absence of signals and so reduce their power consumption.

In other embodiments, such methods also include biasing one or more back control gates according to the current state of the transistor. In such methods, the applied bias typically varies every cycle, or every few cycles, of circuit operation. For example, they include applying a first potential to the back control gate when the transistor is in the off-state (according to the front control gate) and a second potential when the transistor is in the on-state (also according to the front control gate). More particularly, when the back control gate is in the low or off-state (e.g., by being connected to ground), the associated transistor has lower conductance and operates at low speed with low leakage, and in the absence of input signals, reduced power consumption. When the back control gate is in the high or on-state (e.g., by being connected to a nominal supply voltage $V_{DD}$) the transistor has higher conductance and operates at higher speeds.

In further more general embodiments, such methods include more generally applying different biases to the back gates of different transistors to either increase conductance or reduce leakage current to optimize their performance according to the particular roles in a circuit or in a circuit environment. Accordingly, these methods can adapt transistors specifically to their particular circuit environments in a particular integrated circuit. They require that the back control gates be appropriately interconnected with back gate lines.

The invention also provides methods of designing standard cell and data-path cells, circuits including a plurality of standard cell or data-path cells and other circuits including transistors of this invention. Concerning individual cells, for example, such methods make an appropriate compromise between driving the back control gate and the physical dimensions of the transistor. As has been already described, an appropriate compromise can achieve, simultaneously, both up to about 20% (preferably about 20%) reduction in the footprint and up to about 20% (preferably about 20%) increase in performance. Other compromises can achieve other combinations of reduced footprint and increased performance (e.g., combinations that only reduce footprint without signification changes in performance, or combinations that only increase performance without signification changes in footprint).

An exemplary cell according to the invention can have an operating speed up to about 20% (preferably at least about 20%) higher, has a footprint up to about 20% (preferably about 20%) lower and a power consumption reduced by up to about 20% (preferably about 20%) in the active mode and by more than one decade in the inactive mode.

Further, the design methods may provide in any particular data-path cell: back control gates for only one, some, or all of the transistors; one or more back gate lines connecting the back control gates of a plurality of transistors; a common back gate line connecting the back control gates of transistors placed along one and the same row (or column) in a particular circuit; and the like.

The articles "a" or "an" are used herein in manners that are not limited to "only one," but can mean "one or more" as appropriate in the context. The words "significant" and "likely" (and similar words of degree) are used here to mean within acceptable and expected limits, usually commercially-acceptable limits. It should be understood that this invention is not limited to commercial uses; intended uses include research uses, special purpose uses, and so forth.

The preferred embodiments of the invention described above do not limit the scope of the invention, since these embodiments are illustrations of several preferred aspects of the invention. Equivalent embodiments are intended to be within the scope of this invention, and indeed, various modifications of the invention in addition to those shown and described herein, such as alternate useful combinations of the elements described, will become apparent to those skilled in the art from the subsequent description. Such modifications are also intended to fall within the scope of the appended claims.

What is claimed is:

1. A data-path cell fabricated on a semiconductor-on-insulator substrate comprising a surface layer of semiconductor material separated from a bulk substrate by a buried insulating layer, the cell comprising:
    an array of field-effect transistors (FETs) having source, channel and drain regions formed in the surface semiconductor layer, wherein the array of FETs forms a data-path cell;
    one or more back-control-gate regions positioned in the bulk substrate beneath the channel regions of one or more selected FETs; and
    one or more back-gate lines conductively linking the back-control-gate regions to sources of selected bias voltages, wherein the back-control-gate regions are configured so that the bias voltages modify the conductance of channel regions overlying the back-control-gate regions.

2. The data-path cell of claim 1, wherein the array comprises one or more rows of FETs, each FET row having source, channel and drain regions of the same width arranged along the row.

3. The data-path cell of claim 2, wherein the channel regions of a row have the same length separating adjacent drain and source regions.

4. The data-path cell of claim 2, wherein at least one back-gate line extends in the bulk substrate along an FET row.

5. The data-path cell of claim 2, further comprising
    one or more isolation regions formed in the surface semiconductor layer and interposed between the FETs of at least one row; and
    one or more back-isolation-gate regions beneath the isolation regions in the bulk substrate;
    wherein the back-gate lines further connect the back-isolation-gate regions to sources of bias voltages selected so that the isolation regions are in an OFF state in order to electrically isolate adjacent FETs on either side of that isolation region from each other.

6. The data-path cell of claim 5, wherein at least one back-isolation-gate region has conductivity of opposite type to the conductivity of the overlying isolation region.

7. The data-path cell of claim 5, wherein at least one back-gate line connects only to back-control-gate regions or only to back-isolation-gate regions, but not to both types of regions.

8. The data-path cell of claim 5, wherein a plurality of FETs with at least one interposed isolation region are in a single active zone of the surface semiconductor layer.

9. The data-path cell of claim 1, wherein at least one back-control-gate region has conductivity of opposite type to the conductivity of the overlying channel region.

10. The data-path cell of claim 1, wherein at least one back-control-gate region is isolated from the bulk substrate by a well of opposite conductivity.

11. The data-path cell of claim 1, wherein at least one back-gate line connects to a single back-control-gate region.

12. The data-path cell of claim 1, wherein at least one bias voltage is selected from a ground potential, a nominal supply voltage, and an adjustable analog potential.

13. A method of operating a data-path cell of claim 1, which comprises selecting the bias voltages to improve the performance of the data-path cell in comparison to a data-path cell of similar configuration but without back-control-gate regions.

14. The method of claim 13, wherein the improved performance comprises increased operating speed.

15. The method of claim 13, wherein the improved performance comprises reduced currents in the OFF state for one or more FETs or increased currents in the ON state for one or more FETs.

16. The method of claim 13, wherein the bias voltage of at least one back-control-gate region is varied depending on whether the overlying FET is ON or OFF.

17. A method of designing a data-path cell of claim 1 to have a determined footprint and a determined performance, which comprises:
    arranging the FETs of the array in one or more rows where the FETs of a row all have source, channel and drain regions of the same width arranged along the row;
    selecting the widths of the FET rows so that the cell has no more than the determined footprint, the footprint depending at least in part on the widths of the FET rows; and positioning back-control-gate regions beneath selected FETs and selecting the bias voltages for the provided regions so that the cell has at least the determined performance, the performance depending at least in part on the capacitances and conductance of the FETS wherein the capacitance and conductance vary with the widths of the FETs, the provided back-control-gate regions and their biases.

18. The method of claim 17, wherein, in comparison to a benchmark data-path cell having initial FET row widths but without back-gate-control regions, one or more of the following are provided:
the determined footprint is reduced and the determined performance is not reduced, or
the determined footprint is not increased and the determined performance is increased, or
the determined footprint is reduced and the determined performance is increased.

19. The method of claim 17, wherein, in comparison to a benchmark data-path cell having initial FET row widths but without back-gate-control regions, the footprint and performance requirements include one of:
the FET capacitances are reduced by up to about 33% and FET conductance are not reduced;
an operating speed is increased about 20% and the footprint is reduced about 20%;
a power consumption is reduced about 20% and the footprint is reduced about 20%; and
an operating speed is increased between about 30 and 50% and the footprint is not increased.

20. An integrated circuit comprising at plurality of the data-path cells of claim 1 arranged in one or more rows along a first direction so that, along a particular row, the output of a data-path cell connects to input of at least one succeeding data-path cell.

21. The circuit structure of claim 20, wherein the data-path cells are arranged in a plurality of rows along a first direction, and wherein the rows are arranged parallel to one another along a different second direction.

22. A data-path cell fabricated on a semiconductor-on-insulator substrate comprising a surface layer of semiconductor material separated from a bulk substrate by a buried insulating layer, the cell comprising:
an array of field-effect transistors (FETs) having source, channel and drain regions formed in the surface semiconductor layer;
one or more back-control-gate regions positioned in the bulk substrate beneath the channel regions of one or more selected FETs;
a well surrounding one or more of the back-control-gate regions to isolate the back-control-gate regions from the bulk substrate, wherein the well is of opposite conductivity compared to the back-control-gate region being isolated; and
one or more back-gate lines conductively linking the back-control-gate regions to sources of selected bias voltages, wherein the back-control-gate regions are configured so that the bias voltages modify the conductance of channel regions overlying the back-control-gate regions.

* * * * *